(12) United States Patent
Takishita et al.

(10) Patent No.: US 10,199,453 B2
(45) Date of Patent: Feb. 5, 2019

(54) SEMICONDUCTOR DEVICE AND METHOD FOR PRODUCING SEMICONDUCTOR DEVICE

(71) Applicant: FUJI ELECTRIC CO., LTD., Kawasaki-shi (JP)

(72) Inventors: Hiroshi Takishita, Matsumoto (JP); Takashi Yoshimura, Matsumoto (JP); Masayuki Miyazaki, Matsumoto (JP); Hidenao Kuribayashi, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 16/045,038

(22) Filed: Jul. 25, 2018

(65) Prior Publication Data

US 2018/0331176 A1    Nov. 15, 2018

Related U.S. Application Data

(60) Continuation of application No. 15/662,601, filed on Jul. 28, 2017, now Pat. No. 10,056,449, which is a
(Continued)

(30) Foreign Application Priority Data

Dec. 15, 2011    (JP) .................................. 2011-274902

(51) Int. Cl.
*H01L 29/00*    (2006.01)
*H01L 27/082*   (2006.01)
(Continued)

(52) U.S. Cl.
CPC ........ *H01L 29/0615* (2013.01); *H01L 21/263* (2013.01); *H01L 29/1095* (2013.01);
(Continued)

(58) Field of Classification Search
CPC ..... H01L 29/0615; H01L 29/32; H01L 29/36; H01L 29/7397; H01L 29/66348;
(Continued)

(56) References Cited

U.S. PATENT DOCUMENTS 8,466,491 B2    6/2013 Werber
8,766,413 B2 *  7/2014 Nemoto ................ H01L 21/263
                                                          257/655
(Continued)

FOREIGN PATENT DOCUMENTS

CN    1439172 A    8/2003
CN    101494223 A  7/2009
(Continued)

OTHER PUBLICATIONS

Official Action issued in Chinese Appln. No. 201280056282.6 dated Feb. 2, 2016.
(Continued)

Primary Examiner — Hsien Ming Lee
(74) Attorney, Agent, or Firm — Rossi, Kimms & McDowell LLP

(57) ABSTRACT

Proton irradiation is performed a plurality of times from rear surface of an n-type semiconductor substrate, which is an n⁻ drift layer, forming an n-type FS layer having lower resistance than the n-type semiconductor substrate in the rear surface of the n⁻ drift layer. When the proton irradiation is performed a plurality of times, the next proton irradiation is performed to as to compensate for a reduction in mobility due to disorder which remains after the previous proton irradiation. In this case, the second or subsequent proton irradiation is performed at the position of the disorder which is formed by the previous proton irradiation. In this way, even after proton irradiation and a heat treatment, the disorder is reduced and it is possible to prevent deterioration
(Continued)

of characteristics, such as increase in leakage current. It is possible to form an n-type FS layer including a high-concentration hydrogen-related donor layer.

9 Claims, 12 Drawing Sheets

Related U.S. Application Data continuation of application No. 15/156,427, filed on May 17, 2016, now Pat. No. 9,722,016, which is a division of application No. 14/276,560, filed on May 13, 2014, now Pat. No. 9,368,577, which is a continuation of application No. PCT/JP2012/082582, filed on Dec. 14, 2012.

(51) Int. Cl.

| | | |
|---|---|---|
| H01L 21/331 | (2006.01) | |
| H01L 29/06 | (2006.01) | |
| H01L 29/36 | (2006.01) | |
| H01L 29/66 | (2006.01) | |
| H01L 29/861 | (2006.01) | |
| H01L 29/739 | (2006.01) | |
| H01L 29/32 | (2006.01) | |
| H01L 21/263 | (2006.01) | |
| H01L 29/10 | (2006.01) | |

(52) U.S. Cl.
CPC .............. *H01L 29/32* (2013.01); *H01L 29/36* (2013.01); *H01L 29/6609* (2013.01); *H01L 29/66333* (2013.01); *H01L 29/66348* (2013.01); *H01L 29/7395* (2013.01); *H01L 29/7397* (2013.01); *H01L 29/861* (2013.01)

(58) Field of Classification Search
CPC ............. H01L 29/7395; H01L 29/1095; H01L 29/861; H01L 29/66333; H01L 29/6609; H01L 29/0646
USPC ....... 257/197, 552, 555–557, 565, 575, 585, 257/617; 438/310, 312, 328, 369, 372, 438/514, 515, 520
See application file for complete search history.

(56) References Cited

U.S. PATENT DOCUMENTS

| | | |
|---|---|---|
| 2002/0001257 A1 | 1/2002 | Koch |
| 2002/0190281 A1 | 12/2002 | Francis et al. |
| 2005/0116249 A1 | 6/2005 | Mauder et al. |
| 2006/0081923 A1 | 4/2006 | Mauder et al. |
| 2006/0286753 A1 | 12/2006 | Barthelmess et al. |
| 2007/0120170 A1 | 5/2007 | Niedernostheide et al. |
| 2008/0001257 A1 | 1/2008 | Schulze et al. |
| 2009/0184340 A1 | 7/2009 | Nemoto et al. |
| 2009/0186462 A1 | 7/2009 | Mauder et al. |
| 2012/0267681 A1 | 10/2012 | Nemoto et al. |
| 2015/0179441 A1 | 6/2015 | Onozawa |

FOREIGN PATENT DOCUMENTS

| | | |
|---|---|---|
| JP | 07193218 A | 7/1995 |
| JP | 2003533047 A | 11/2003 |
| JP | 2004079878 A | 3/2004 |
| JP | 2006344977 A | 12/2006 |
| JP | 2007266233 A | 10/2007 |
| JP | 2008211148 A | 9/2008 |
| WO | 0186712 A1 | 11/2001 |
| WO | 2011052787 A | 5/2011 |

OTHER PUBLICATIONS

Extended European Search Report issued in European Appln. No. 12857108.0 dated Jun. 19, 2015.
Office Action issued in Japanese Appln. No. 2013-549339 dated Jan. 6, 2015.
International Search Report issued in Intl. Appln. No. PCT/JP2012/082582 dated Mar. 5, 2013.
Office Action issued in U.S. Appl. No. 14/276,560 dated May 29, 2015.
Quayle Action issued in U.S. Appl. No. 14/276,560 dated Oct. 21, 2015.
Notice of Allowance issued in U.S. Appl. No. 14/276,560 dated Feb. 24, 2016.
Written Opinion issued in Intl. Appln. No. PCT/JP2012/082582 dated Mar. 5, 2013. English translation provided.
Office Action issued in U.S. Appl. No. 15/156,427 dated Jun. 27, 2016.
Notice of Allowance issued in U.S. Appl. No. 15/156,427 dated Mar. 22, 2017.
Office Action issued in U.S. Appl. No. 15/662,601 dated Sep. 8, 2017.
Notice of Allowance issued in U.S. Appl. No. 15/662,601 dated Apr. 23, 2018.
Office Action issued in European Appln. No. 12857108.0 dated Sep. 21, 2017.

\* cited by examiner

| RATED VOLTAGE (V) | BREAKDOWN VOLTAGE (V) | TOTAL THICKNESS OF SUBSTRATE (μm) | RESISTIVITY (Ωcm) | AVERAGE CONCENTRATION OF DRIFT LAYER (/cm³) | RATED CURRENT DENSITY (A/cm²) | DISTANCE INDEX L (μm) | FS LAYER WHICH END OF DEPLETION LAYER REACHES FIRST: DISTANCE X FROM REAR SURFACE (μm) | | | | | | | | | | |
|---|---|---|---|---|---|---|---|---|---|---|---|---|---|---|---|---|---|
| | | | | | | | W0-0.7L | W0-0.8L | W0-0.9L | W0-1.0L | W0-1.1L | W0-1.2L | W0-1.3L | W0-1.4L | W0-1.5L | W0-1.8L |
| 600 | 700 | 60 | 30 | $1.5 \times 10^{14}$ | 300 | 31.9 | 37.7 | 34.5 | 31.3 | 28.1 | 24.9 | 21.7 | 18.5 | 15.3 | 12.1 | 8.9 |
| 1200 | 1400 | 120 | 60 | $7.7 \times 10^{13}$ | 200 | 58.2 | 79.2 | 73.4 | 67.6 | 61.8 | 55.9 | 50.1 | 44.3 | 38.5 | 32.7 | 26.8 |
| 1700 | 1900 | 170 | 85 | $5.4 \times 10^{13}$ | 150 | 80.8 | 113.4 | 105.3 | 97.3 | 89.2 | 81.1 | 73.0 | 64.9 | 56.9 | 48.8 | 40.7 |
| 3300 | 3500 | 330 | 165 | $2.8 \times 10^{13}$ | 80 | 155.0 | 221.5 | 206.0 | 190.5 | 175.0 | 159.5 | 144.0 | 128.5 | 113.0 | 97.5 | 82.0 |
| 4500 | 4700 | 450 | 225 | $2.0 \times 10^{13}$ | 50 | 223.1 | 293.8 | 271.5 | 249.2 | 226.9 | 204.6 | 182.3 | 160.0 | 137.7 | 115.4 | 93.1 |
| 6500 | 6700 | 650 | 325 | $1.4 \times 10^{13}$ | 30 | 337.3 | 413.9 | 380.1 | 346.4 | 312.7 | 278.9 | 245.2 | 211.5 | 177.7 | 144.0 | 110.3 |

FIG. 13

SEMICONDUCTOR DEVICE AND METHOD FOR PRODUCING SEMICONDUCTOR DEVICE

BACKGROUND OF THE INVENTION

A. Field of the Invention

The present invention relates to a semiconductor device and a method for producing a semiconductor device.

B. Description of the Related Art

A power conversion apparatus, such as a converter-inverter system essential for the control of a rotary motor or a servo-motor, has been known. In order to improve the efficiency of the power conversion apparatus and to reduce the power consumption thereof, there is a strong demand for a technique capable of reducing the loss of a semiconductor device, such as a power diode or an insulated gate bipolar transistor (IGBT) provided in the power conversion apparatus.

As one of the methods for meeting the demand for the technique capable of reducing the loss, for a diode or an IGBT, a field stop (FS) layer structure has been known in which a drift layer, which is a thick layer with the highest resistance, among semiconductor layers forming an element structure is thinned to reduce a voltage drop due to an on-current, thereby reducing on-loss. In the FS layer structure, an FS layer which has a higher impurity concentration than the drift layer and has the same conduction type as the drift layer is provided at a position that is away from the breakdown voltage main junction of the drift layer in the drift layer. The provision of the FS layer makes it possible to suppress the spreading of a depletion layer which is spread from the breakdown voltage main junction in the high-resistance drift layer when the device is turned off. Therefore, it is possible to prevent punch-through even when the drift layer is thin.

In the manufacture (production) of the power device, a wafer (hereinafter, referred to as an FZ wafer) which is cut out from an ingot produced by a floating zone (FZ) method is used in order to reduce costs. The FZ wafer with a thickness of 600 μm or more is put into a manufacturing process in order to reduce the breaking of the wafer. Finally, the FZ wafer is ground to a thickness required for the designed breakdown voltage during the manufacturing process in order to reduce on-loss. In particular, in a MOS (metal-oxide film-semiconductor) device, such as an IGBT, after a MOS gate structure, a circumferential junction edge termination structure, and a metal electrode film are formed on the front surface of the FZ wafer, a grinding process for thinning the FZ wafer is performed for the rear surface of the FZ wafer. Then, after the rear surface of the FZ wafer is ground to reduce the thickness of the wafer, an FS layer or a collector layer is formed on the ground rear surface of the FZ wafer. Therefore, in the method according to the related art, there are restrictions that the FS layer is formed under the conditions that have no adverse effect on the semiconductor function layers provided on the front surface side of the FZ wafer. Therefore, it is not easy to form the FS layer. In general, the FS layer is formed with, for example, an n-type impurity element with a large diffusion coefficient. In some cases, in addition to an FZ wafer which is made of polysilicon with high crystal purity, an FZ wafer made of a CZ wafer or a CZ wafer with high resistivity is used.

In recent years, a method has been developed which forms the FS layer using a process of generating donors using proton irradiation. In the method for forming the FS layer using proton irradiation, a heat treatment is performed to recover the crystal defects which are generated in an FZ bulk wafer by irradiation with proton ions (H+) and protons in the vicinity of the average range Rp of protons in the FZ bulk wafer are changed into donors to form an n-type region with high concentration.

In some cases, when the n-type region with high concentration is formed by proton irradiation, the mobility of electrons/holes is reduced at the irradiation position of the proton, which is described in the patent literature (for example, see the following Patent Literature 1). In addition, proton irradiation conditions for forming a blocking zone (FS layer) and the preferred heat treatment conditions after proton irradiation have been proposed when the n-type region with high concentration is formed by proton irradiation (for example, see the following Patent Literature 3 to the following Patent Literature 7). Unlike other ions, protons are combined with the crystal defects in the semiconductor layer to recover carrier concentration. As the concentration of the crystal defects generated in the semiconductor layer during proton irradiation increases, higher carrier concentration is obtained, which is described in the patent literature (for example, see the following Patent Literature 2).

The following Patent Literature 1 discloses a region in which the mobility of electrons/holes is reduced due to proton irradiation. Specifically, it has been reported that the mobility of carriers is reduced by a high-concentration crystal defect layer which is formed in the vicinity of the rear surface of the wafer by proton irradiation. The following Patent Literature 2 discloses a structure in which, when the crystal defects generated by proton irradiation are recovered by a heat treatment, the remaining amount of crystal defects is so large that a donor layer is not removed by protons. The general impurity atoms, such as phosphorous (P) atoms or arsenic (As) atoms which are present at the lattice positions of silicon (Si), exchange an outermost electron. In contrast, in the above description, a donor (hereinafter, referred to as a hydrogen-related donor) caused by hydrogen (H) supplies an electron from a composite defect of a plurality of lattice defects (for example, divacancies) which are formed in silicon by proton irradiation and the radiated hydrogen atom.

CITATION LIST

Patent Literature 1: US 2005/0116249
Patent Literature 2: JP 2006-344977 A
Patent Literature 3: US 2006/0081923
Patent Literature 4: JP 2003-533047 W
Patent Literature 5: US 2009/0186462
Patent Literature 6: US 2008/0001257
Patent Literature 7: US 2007/0120170

SUMMARY OF THE INVENTION

However, as described above, when the hydrogen-related donor is formed with a higher concentration than the impurity concentration of the semiconductor substrate (FZ wafer) by proton irradiation, a large amount of disorder (a state in which lattice defect density is high and the moving distance of atoms from a crystal position is large and which is close to an amorphous state) is introduced into the semiconductor substrate by the proton irradiation. As a result, the mobility of carriers is greatly reduced from an ideal value in a crystal. In a case in which a device is produced in this state, when a depletion layer which is spread at the time a voltage is applied to the device reaches the region in which the disorder remains, a large number of carriers are generated from the center of the defect and a large leakage current which is beyond the allowable range is generated. In addition, since the mobility of carriers is reduced, the on-voltage of the IGBT increases and conduction loss increases. Since the disorder in the semiconductor substrate becomes a recombination center, carrier concentration is reduced and carriers are likely to be depleted when the device is turned off, which causes turn-off oscillation.

When the crystal defects in the semiconductor substrate are recovered by an annealing process to remove the disorder in order to solve the above-mentioned problems, the hydrogen-related donor is also removed by the annealing process for removing the disorder since it is a composite defect. As such, there is a trade-off relation between the ensuring of the desired hydrogen-related donor concentration and the removal of the disorder remaining in the semiconductor substrate. In order to improve the trade-off relation, it is necessary to sufficiently remove the disorder while leaving the hydrogen-related donor in the semiconductor substrate. However, a method for obtaining this state has not been known. Therefore, there is an urgent need to develop a new means capable of ensuring the desired hydrogen-related donor concentration even when the disorder is sufficiently removed.

In order to obtain good switching characteristics, it is necessary to form the FS layer in the region that is at a depth of 15 μm or more from the rear surface of the semiconductor substrate. However, the inventors found that, when the average range of proton irradiation was set to 15 μm or more in order to form the FS layer in the region that was at a depth of 15 μm or more from the rear surface of the semiconductor substrate, a proton passage region which was at a depth of 15 μm from the rear surface of the semiconductor substrate was a region in which carrier concentration measured by a spread-resistance profiling (SR) method was significantly lower than the doping concentration of the semiconductor substrate, that is, a disorder region.

FIG. 8 is a characteristic diagram illustrating the relation between carrier concentration and the average range of proton irradiation in the related art. FIG. 8 shows the carrier concentration of a silicon substrate measured by the SR method after proton irradiation is performed for the silicon substrate and then a heat treatment is performed at a temperature of 350° C. FIG. 8(a) shows a case in which the average range of the proton irradiation is 50 μm, FIG. 8(b) shows a case in which the average range of the proton irradiation is 20 μm, and FIG. 8(c) shows a case in which the average range of the proton irradiation is 10 μm. In FIGS. 8(a) to 8(c), the horizontal axis is a distance (depth) from a proton incident surface. In FIG. 8(c), when the average range of the proton irradiation is 10 μm, a reduction in carrier concentration does not appear in, particularly, the proton passage region. On the other hand, in FIG. 8(b), when the average range of the proton irradiation is 20 μm, the carrier concentration is lower than the substrate concentration and a reduction in the carrier concentration appears. That is, disorder remains in the region. As can be seen from FIG. 14(a), when the average range of the proton irradiation is 50 μm, a reduction in the carrier concentration of the passage region is remarkable and a large amount of disorder remains. As such, when there is a disorder region in the semiconductor substrate, a leakage current or conduction loss increases, as described above. Therefore, it is necessary to remove disorder.

An object of the invention is to provide a semiconductor device which has a small amount of disorder and includes a region in which hydrogen-related donor concentration is high and a method for producing the semiconductor device, in order to solve the problems of the related art.

In order to solve the above-mentioned problems and achieve the object of the invention, there is provided a method for producing a semiconductor device including a breakdown voltage holding pn junction that is provided in one main surface of an n-type semiconductor substrate and an n-type field stop layer that is provided in the other main surface of the n-type semiconductor substrate, has a lower resistance than the n-type semiconductor substrate, and suppresses the spreading of a depletion layer from the breakdown voltage holding pn junction. The method for producing a semiconductor device has the following characteristics. A proton irradiation step of repeatedly performing proton irradiation a plurality of times from the other main surface of the n-type semiconductor substrate to form the n-type field stop layer in the other main surface of the n-type semiconductor substrate is performed. In the proton irradiation step, whenever the proton irradiation is repeated, the next proton irradiation is performed so as to compensate for a reduction in mobility due to a disorder which remains in the previous proton irradiation.

In the method for producing a semiconductor device according to the invention, in the proton irradiation step, an irradiation depth in the next proton irradiation may be less than an irradiation depth in the previous proton irradiation.

In the method for producing a semiconductor device according to the invention, in the proton irradiation step, the second or subsequent proton irradiation may be repeatedly performed on the basis of the position of the disorder formed by the previous proton irradiation.

In the method for producing a semiconductor device according to the invention, in the proton irradiation step, the acceleration energy and dose of the proton irradiation may be adjusted such that a portion in which impurity concentration is reduced by the disorder formed by the previous proton irradiation is compensated by a peak of an impurity concentration distribution formed by the second or subsequent proton irradiation.

In the method for producing a semiconductor device according to the invention, in the proton irradiation step, a depth at which the reduction in mobility due to the disorder is the maximum after the previous proton irradiation may be the irradiation depth in the next proton irradiation.

In the method for producing a semiconductor device according to the invention, when the common logarithm log(E) of the acceleration energy E of the proton irradiation is y and the common logarithm log(Rp) of an average range Rp of the proton irradiation from the other main surface is x, $y=-0.0047x^4+0.0528x^3-0.2211x^2+0.9923x+5.0474$ may be satisfied.

In the method for producing a semiconductor device according to the invention, the semiconductor device may be a diode or an IGBT.

In order to solve the above-mentioned problems and achieve the object of the invention, a semiconductor device according to the invention has the following characteristics. A breakdown voltage holding pn junction is provided in one main surface of an n-type semiconductor substrate. An n-type field stop layer which has a lower resistance than the n-type semiconductor substrate and suppresses the spreading of a depletion layer from the breakdown voltage holding pn junction is provided in the other main surface of the n-type semiconductor substrate. The n-type field stop layer has an impurity concentration distribution which includes a plurality of impurity concentration peaks at different positions in a depth direction of the n-type semiconductor substrate. Among the plurality of impurity concentration peaks, an impurity concentration peak closest to the one main surface of the n-type semiconductor substrate is disposed at a depth of 15 μm or more from the other main surface of the n-type semiconductor substrate. A distance between the position of the impurity concentration peak in the n-type field stop layer and the other main surface of the n-type semiconductor substrate is equal to or more than half of a distance between the position of the impurity concentration peak adjacent to the one main surface of the n-type semiconductor substrate among the impurity concentration peaks and the other main surface of the n-type semiconductor substrate.

In the semiconductor device according to the invention, among the plurality of impurity concentration peaks, an impurity concentration peak which is closest to the other main surface of the n-type semiconductor substrate may be disposed at a depth of 6 μm to 15 μm from the other main surface of the n-type semiconductor substrate.

According to the semiconductor device and the method for producing the semiconductor device of the invention, it is possible to reduce the degree of disorder generated in the semiconductor substrate after proton irradiation and a heat treatment. In addition, according to the semiconductor device and the method for producing the semiconductor device of the invention, it is possible to prevent deterioration of characteristics, such as an increase in leakage current, and form a region with high hydrogen-related donor concentration.

BRIEF DESCRIPTION OF THE DRAWINGS

The foregoing advantages and features of the invention will become apparent upon reference to the following detailed description and the accompanying drawings, of which:

FIG. 13 is a table illustrating the position conditions of a field stop layer which a depletion layer reaches first in the semiconductor device according to the invention.

DETAILED DESCRIPTION OF SPECIFIC EMBODIMENTS

Figure 1A:
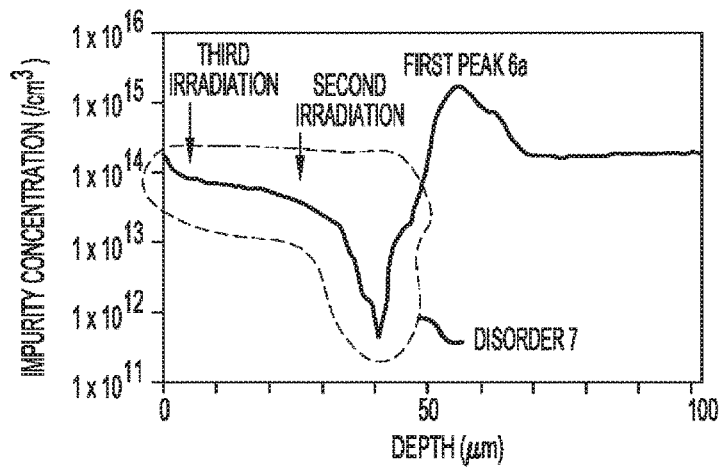
FIGS. 1(a) to 1(c) are characteristic diagrams illustrating the impurity concentration profile of an n-type FS layer in a semiconductor device according to Embodiment 1.

Hereinafter, a semiconductor device and a method for producing a semiconductor device according to exemplary embodiments of the invention will be described in detail with reference to the accompanying drawings. In the specification and the accompanying drawings, in the layers or regions having "n" or "p" appended thereto, an electron or a hole means a majority carrier. In addition, symbols "+" and "−" added to n or p mean that impurity concentration is higher and lower than that of the layer or the region without the symbols. In the description of the following embodiments and the accompanying drawings, the same components are denoted by the same reference numerals and the description thereof will not be repeated. The invention is not limited to the following embodiments as long as it does not depart from the spirit and scope thereof.

Embodiment 1

Figure 2A:
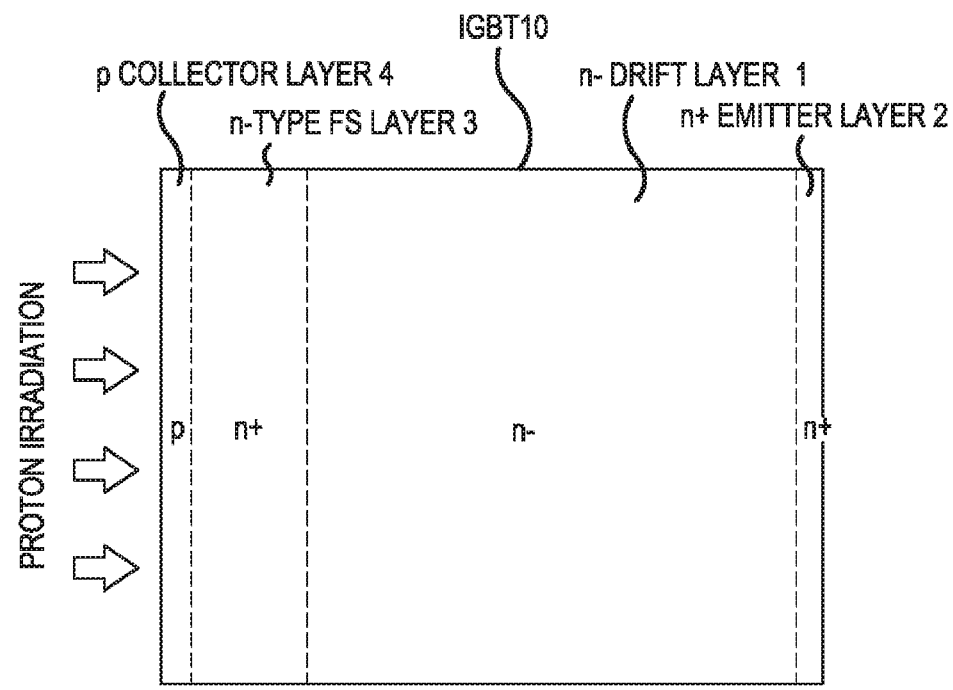
FIGS. 2(a) and 2(b) are cross-sectional views schematically illustrating the structure of a general IGBT.
Figure 2B:
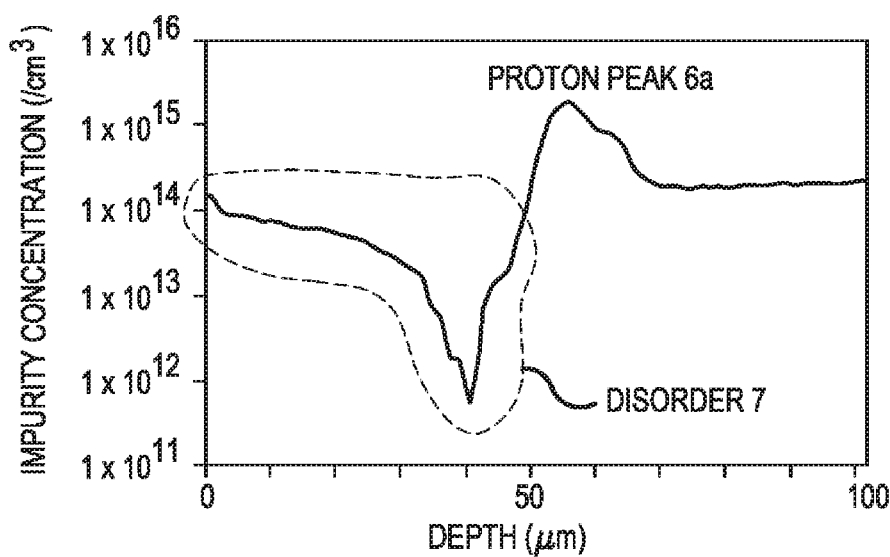

FIG. 2 is a cross-sectional view schematically illustrating the structure of a general IGBT. FIG. 2(a) is a schematic cross-sectional view illustrating the IGBT including an n-type field stop (FS) layer 3 which is formed by a general proton irradiation method according to the related art. FIG. 2(b) shows the impurity concentration profile of the n-type FS layer 3 which is measured by a known spreading resistance (SR) measurement method. However, in the schematic cross-sectional view of the IGBT, which is an example of the semiconductor device according to the invention, the semiconductor device according to the invention has the same layer structure as that shown in FIG. 2(a). Therefore, the cross-sectional view shown in FIG. 2(a) is used in the description of the semiconductor device according to the invention. An IGBT produced by a semiconductor device production method according to the invention differs from the IGBT produced by the method according to the related method in the impurity concentration profile of the n-type FS layer 3 shown in FIG. 2(b). The impurity concentration profile of the n-type FS layer 3 in the IGBT according to the invention will be described below.

Figure 10A:
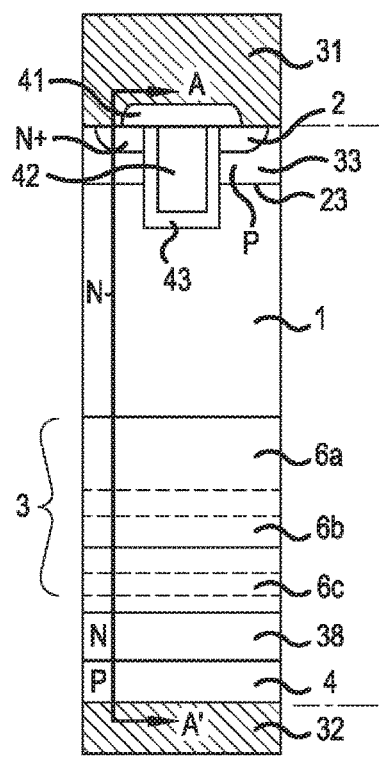
FIGS. 10(a) and 10(b) are diagrams illustrating the structure and net doping concentration of the general IGBT.
Figure 10B:
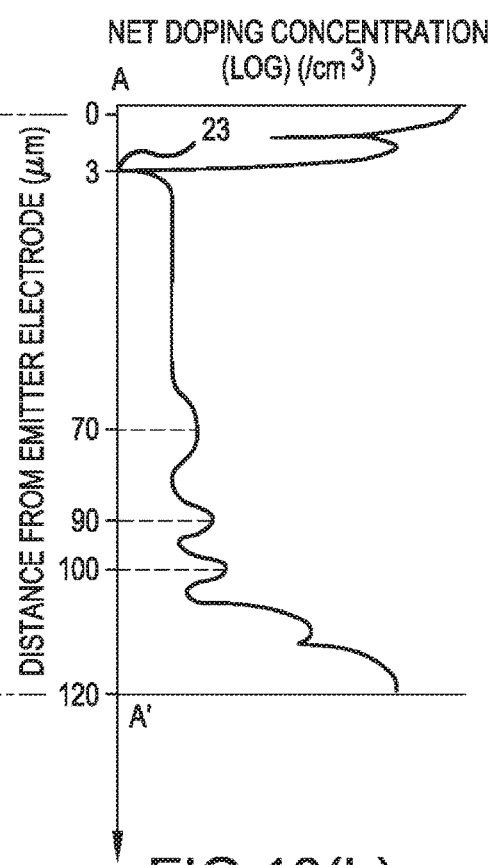

FIG. 10 is a diagram illustrating net doping concentration and the structure of the general IGBT. In the general IGBT shown in FIG. 10, a MOS gate structure including a p base layer 33, an n+ emitter layer 2, pn junction 23, an interlayer dielectric 41, a gate insulating film 43, and a gate electrode 42 is formed on one main surface of an n⁻ drift layer 1 (high-resistance semiconductor layer) which is an n-type semiconductor substrate. In FIG. 2(a), for simplicity of illustration, the components of the MOS gate structure other than the n+ emitter layer 2 are not shown. The n-type FS layer 3 which has a higher impurity concentration than the n⁻ drift layer 1 and is formed by proton irradiation and a p collector layer 4 which comes into contact with the surface (the other main surface) of the n-type FS layer 3 are formed on the other main surface of the n⁻ drift layer 1. The n-type FS layer 3 has a plurality of impurity concentration peaks (proton peaks), that is, a first concentration peak 6a, a second concentration peak 6b, and a third concentration peak 6c at different positions in the depth direction of the substrate. The distances of the proton peaks from an emitter electrode 31 are, for example, 60 µm, 90 µm, and 115 µm. The emitter electrode 31 which comes into contact with the p base layer 33 and the n+ emitter layer 2 is formed on the front surface of the substrate. A collector electrode 32 which comes into contact with the p collector layer 4 is formed on the rear surface of the substrate. In addition, an n-type leakage stop layer 38 is formed so as to come into contact with the p collector layer 4. However, the n-type leakage stop layer 38 may not be provided.

The method for forming the n-type FS layer 3 using proton irradiation is a known technique. However, as disclosed in Patent Literature 1 and Patent Literature 2, in order to form the donor layer (hereinafter, referred to as a hydrogen-related donor layer) using proton irradiation, the crystal defects generated by proton irradiation need to remain, without being recovered by an annealing process after the proton irradiation. In the above-mentioned method according to the related art, since the crystal defects remain in the n-type FS layer 3, the impurity concentration peak (hereinafter, referred to as a proton peak) 6a of the n-type FS layer 3 increases. However, since disorder 7 also remains, a problem, such as an increase in leakage current due to the disorder 7, is likely to arise.

The invention is characterized by an improvement in the proton irradiation method for suppressing the occurrence of the disorder 7 in the n-type FS layer 3 when the n-type FS layer 3 is formed by proton irradiation. The other portions of the IGBT 10 (for example, a MOS gate structure, an oxide film, a pn junction, an electrode, and a protective film on the front surface of the substrate) can be formed by the same production method as the known production method. Therefore, in the following description, the detailed description of the known processes of the IGBT production method will not be repeated.

Figure 3:
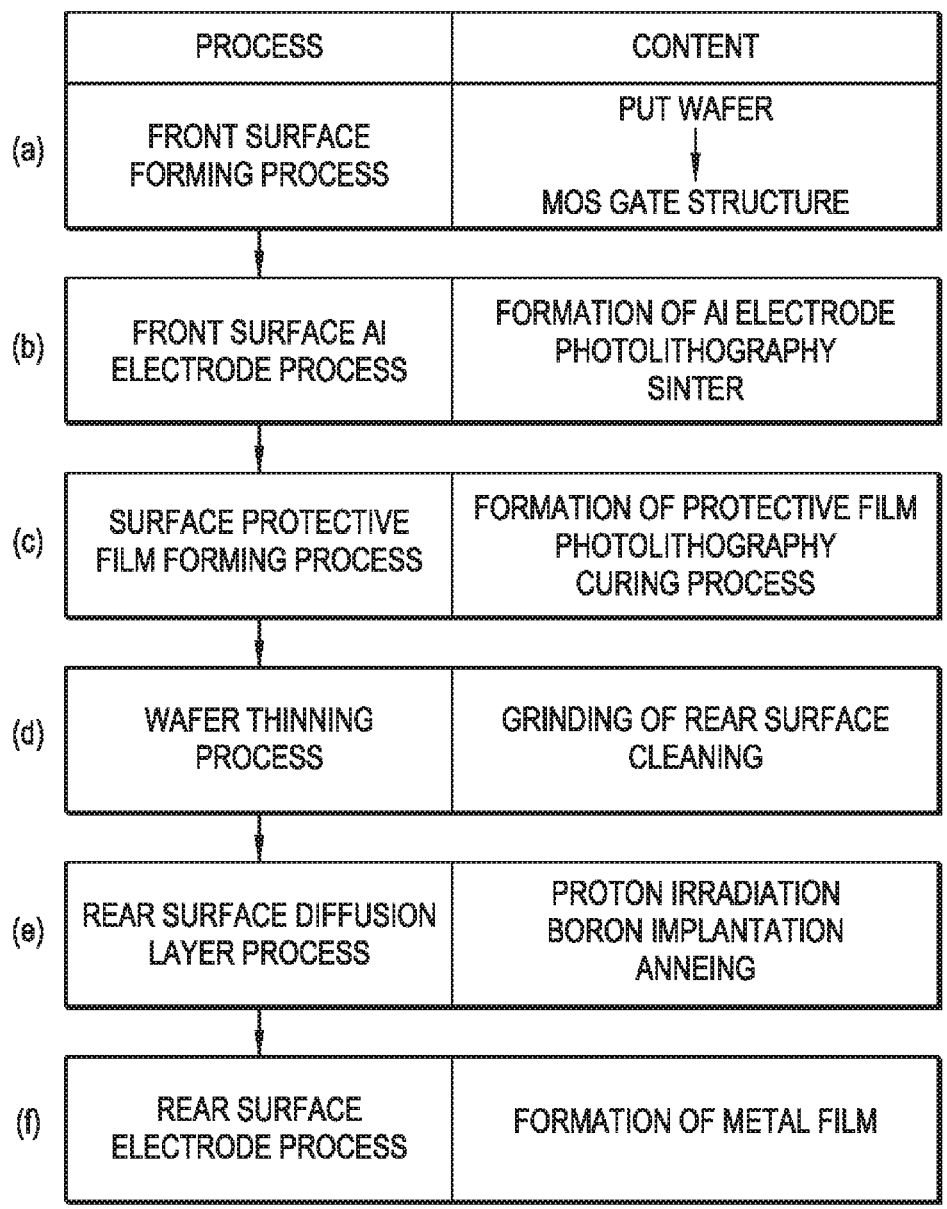
FIG. 3 is a flowchart illustrating the outline of a method for producing the semiconductor device according to Embodiment 1.

First, a semiconductor device production method according to Embodiment 1 will be described with reference to FIG. 3, using an IGBT production method as an example. FIG. 3 is a flowchart illustrating the outline of the semiconductor device production method according to Embodiment 1. First, a front surface forming process is performed which forms, for example, a MOS gate structure including a p base layer (not shown), the n+ emitter layer 2, a gate insulating film (not shown), and a gate electrode (not shown) in a front surface of an n-type semiconductor substrate (wafer) using a general method (FIG. 3(a)).

Then, a front surface Al electrode process is performed which forms an emitter electrode (not shown) that is, for example, an aluminum (Al) electrode and commonly comes into conductive contact with the surfaces of both the p base layer and the n+ emitter layer 2 (FIG. 3(b)). Then, a surface protective film forming process is performed which forms a polyimide film, which is a surface protective film, on the front surface of the n-type semiconductor substrate (FIG. 3(c)). Then, a wafer thinning process is performed which grinds the rear surface of the n-type semiconductor substrate in order to reduce the thickness of the n-type semiconductor substrate to a predetermined value that is determined by the relation with a breakdown voltage (FIG. 3(d)).

Then, a rear surface diffusion layer process is performed which implants protons and boron (B) ions into the ground rear surface of the n-type semiconductor substrate a plurality of times and forms an n-type FS layer 3 and a p collector layer 4 using an annealing process (FIG. 3(e)). Then, a rear surface electrode process is performed which forms a metal film serving as a collector electrode that comes into conductive contact with the surface of the p collector layer 4 using a vacuum sputtering method (FIG. 3(f)). In this way, an IGBT with an FS structure according to Embodiment 1 is completed.

The n-type FS layer 3 has an impurity concentration profile which has a plurality of impurity concentration peaks (proton peaks) at different positions in the depth direction of the substrate, due to the plurality of proton irradiation operations in the rear surface diffusion layer process. Hereinafter, the proton peak formed by m-th proton irradiation is referred to as an m-th proton peak $6n$ (m=1, 2, . . . , and n=a, b, . . . ). A method of performing proton irradiation a plurality of times in the rear surface diffusion layer process will be described below.

Next, the impurity concentration profile of the n-type FS layer 3 will be described. FIG. 1 is a characteristic diagram illustrating the impurity concentration profile of the n-type FS layer in the semiconductor device according to Embodiment 1. FIG. 1 shows the impurity concentration profile of the n-type FS layer 3 after proton irradiation is performed from the rear surface of the n-type semiconductor substrate and then an annealing process is performed during the manufacture of the semiconductor device shown in FIG. 2(a). The vertical axis is the impurity concentration of the n-type FS layer 3 and the horizontal axis is a depth from the rear surface of the n-type semiconductor substrate. The impurity concentration profile of the n-type FS layer 3 shown in FIG. 1 can be obtained by the known SR method (which holds for FIGS. 4 to 7). In general, the value of the mobility of a silicon crystal is used as the value of mobility which is used to convert resistivity and carrier concentration from spreading resistance in, for example, a measurement device. Therefore, the converted carrier concentration is calculated to be lower than activation dopant concentration, considering a reduction in the actual mobility.

FIG. 1 shows a change in the impurity concentration profile of the n-type FS layer 3 when the proton irradiation and the annealing process are repeated until disorder is removed or the degree of disorder is reduced (which is holds for FIGS. 5 to 7). FIG. 1(a) shows the impurity concentration profile of the n-type FS layer 3 after first proton irradiation and an annealing process. As shown in FIG. 1(a), after the first proton irradiation and the annealing process, one mountain (first proton peak 6a) with high impurity concentration is formed at a deep position from the rear surface of the substrate in the n-type FS layer 3 and a region (a portion surrounded by a dotted line) of the disorder 7 in which impurity concentration is significantly lower than the impurity concentration of the silicon substrate (semiconductor substrate) is disposed on the irradiation surface (the rear surface side of the substrate) side. That is, in FIG. 1(a), when the disorder 7 occurs, a reduction in mobility is reflected in the impurity concentration converted from spreading resistance and the impurity concentration is reduced.

Figure 1B:
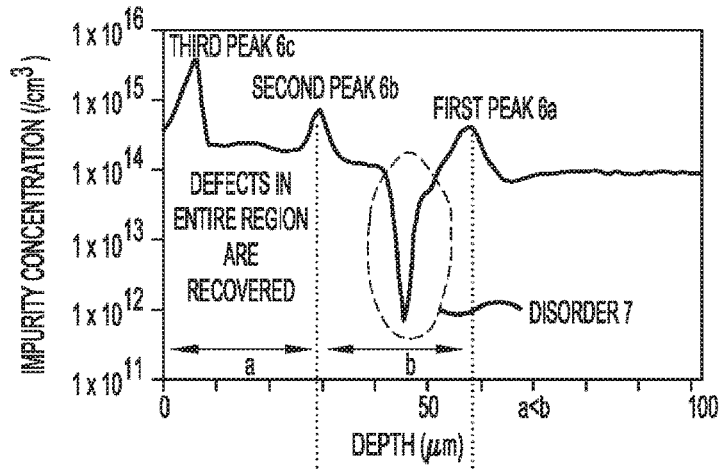

FIG. 1(b) shows the impurity concentration profile of the n-type FS layer 3 after second and third proton irradiation operations and the annealing processes. FIG. 1(b) shows the impurity concentration profile of the n-type FS layer 3 when the second proton peak 6b is formed at a position which is closer to the rear surface of the substrate than the intermediate position between the rear surface of the substrate and the position of the first proton peak 6a. In FIG. 1(b), the third proton peak 6c is also formed at a position close to the rear surface of the substrate. As shown in FIG. 1(b), after the second and third proton irradiation operations and the annealing processes, the disorder 7 in which impurity concentration is significantly lower than the impurity concentration of the silicon substrate remains in a region between the first proton peak 6a and the second proton peak 6b. As shown in FIGS. 1(a) and 1(b), in the case in which the region of the disorder 7 is formed in the n-type FS layer 3, when a depletion layer which is spread from a breakdown voltage main junction of the IGBT 10 at the time the IGBT 10 is turned on goes into the region of the disorder 7, the disorder 7 causes the generation of a leakage current and the amount of leakage current increases, which is not preferable.

Figure 1C:
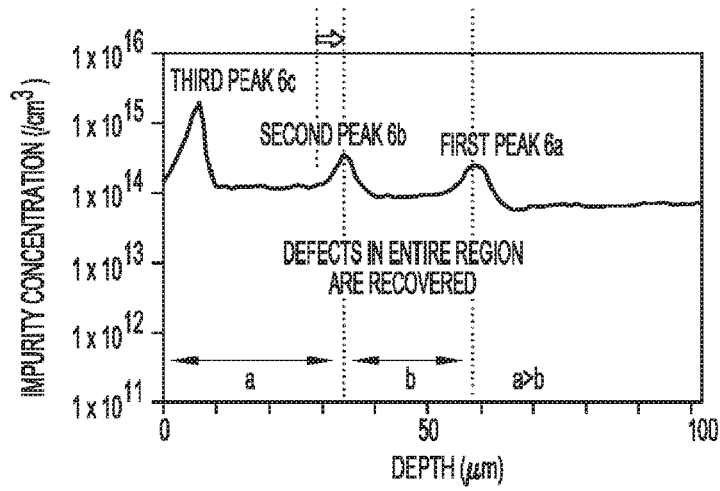

Next, a proton irradiation method according to Embodiment 1 capable of suppressing a reduction (a reduction in mobility) in the impurity concentration of the n-type FS layer 3 shown in FIGS. 1(a) and 1(b) will be described in detail. FIG. 1(c) shows the impurity concentration profile of the n-type FS layer 3 when an irradiation position is adjusted, the second proton irradiation and the annealing process are performed, and then the third proton irradiation and the annealing process are performed. In Embodiment 1, after the first proton irradiation for forming the n-type FS layer 3 on the rear surface of the IGBT 10 is performed, irradiation conditions, such as proton acceleration energy, are changed, proton irradiation is sequentially performed a plurality of times at the position that is closer to the rear surface of the substrate than the position of the first proton peak 6a from the rear surface of the substrate, and the annealing process is performed. That is, after the first proton irradiation shown in FIG. 1(a), the hydrogen-related donor layer is formed in the n-type FS layer 3 by a plurality of proton irradiation operations to compensate for the hydrogen-related donor concentration of the n-type FS layer 3. In this way, as shown in FIG. 1(c), it is possible to reduce the degree of the disorder 7 (the degree of reduction in impurity concentration due to the disorder 7) formed by the first proton irradiation or remove the disorder 7. It is presumed that the degree of the disorder 7 is reduced because a dangling bond which is present in a portion with the largest disorder 7 is terminated by the implanted proton (that is, a hydrogen atom).

Specifically, first, after the first proton irradiation, the distribution of the disorder 7 formed by the first proton irradiation is measured by the SR method. Then, the second and third proton irradiation operations are performed at the position that is closer to the rear surface of the substrate than the position of the first proton peak 6a shown in FIG. 1(a), that is, the second and third irradiation positions represented by arrows in FIG. 1(a) in the impurity concentration profile of the n-type FS layer 3 shown in FIG. 1(a), in order to reduce the degree of the disorder 7 or to remove the disorder 7 on the basis of the depth of the disorder 7 from the rear surface of the substrate. The first to third proton irradiation operations are performed at different acceleration energy levels. As described above, when the second proton peak 6b is formed at the position that is closer to the rear surface of the substrate than the intermediate position between the rear surface of the substrate and the first proton peak 6a, the disorder 7 remains at the intermediate position between the first proton peak 6a and the second proton peak 6b (FIG. 1(b)). This is because the position of the second proton peak 6b is not appropriate. Specifically, a distance b between the position of the first proton peak 6a and the second proton peak 6b is more than a distance a between the position of the second proton peak 6b and the irradiation surface (the rear surface of the substrate). As a result, the doping concentration effect by the second proton peak 6b (hydrogen-related donor layer) is reduced.

As can be seen from FIG. 1(c), when the second proton irradiation position is the position of the disorder 7 generated by the first proton irradiation or is in the vicinity of the position of the disorder 7, it is possible to remove almost all of the disorder 7. Therefore, as shown in FIG. 1(c), the second proton irradiation position is adjusted to improve the doping compensation effect by the second proton peak 6b (hydrogen-related donor layer). For example, the distance between the second proton irradiation position and the rear surface of the substrate may be equal to or more than half of the distance between the first proton irradiation position and the rear surface of the substrate. That is, the average range of the second proton irradiation may be equal to or more than half of the average range of the first proton irradiation. The average range means the depth of the peak concentration position of the impurity concentration distribution of the n-type FS layer 3, which is represented by a Gaussian distribution, from the rear surface of the substrate. Specifically, the average range is a depth from the rear surface of the substrate to the proton peak position. A method of setting the second proton irradiation position will be described below. The difference between the second proton irradiation position shown in FIG. 1(c) and the second proton irradiation position shown in FIG. 1(b) is represented by a white arrow in FIG. 1(c). An example of the detailed ion implantation conditions of three proton irradiation operations when the impurity concentration profile of the n-type FS layer 3 without the disorder 7 is obtained will be described below. However, the ion implantation conditions are not particularly limited.

The acceleration energy and dose of proton irradiation (that is, the first proton irradiation) for forming the first proton peak 6a are 2.3 MeV and $3\times10^{13}$ cm$^2$, respectively. The acceleration energy and dose of proton irradiation (that is, the second proton irradiation) for forming the second proton peak 6b are 1.5 MeV and $3\times10^{13}$ cm$^2$, respectively. The acceleration energy and dose of proton irradiation (that is, the third proton irradiation) for forming the third proton peak 6c are 0.5 MeV and $2\times10^{14}$ cm$^2$, respectively. The average range of the third proton irradiation is, for example, from 6 µm to 15 µm from the rear surface of the substrate. It is preferable that, after the proton irradiation, the annealing process be performed, for example, at a temperature of about 450° C. for 5 hours in a reduction atmosphere (for example, a hydrogen atmosphere in which hydrogen concentration is 3% or a nitrogen atmosphere including hydrogen).

When irradiation is performed in four stages, instead of three stages, the detailed ion implantation conditions of the fourth proton irradiation are as follows. The acceleration energy and dose of the first proton irradiation are 1.5 MeV and $2\times10^{13}$/cm$^2$, respectively. The acceleration energy and dose of the second proton irradiation are 1.1 MeV and $2\times10^{13}$/cm$^2$, respectively. The acceleration energy and dose of the third proton irradiation are 0.8 MeV and $5\times10^{13}$/cm$^2$, respectively. The acceleration energy and dose of proton irradiation (that is, the fourth proton irradiation) for forming a fourth proton peak are 0.4 MeV and $1\times10^{14}$/cm$^2$, respectively. For example, it is preferable that, after the proton irradiation, the annealing process be performed in a reduction atmosphere at a temperature of about 380° C. to 450° C. four 5 hours.

As shown in FIG. 1(c), the positional relationship between the first proton peak 6a and the second proton peak 6b is an important point of the invention. As shown in FIG. 1(a), only the formation of the first proton peak 6a causes the disorder 7 to be formed closer to the irradiation surface (the rear surface of the substrate) than the position of the first proton peak 6a. At the position where the degree of the disorder 7 is the largest, a reduction in mobility is the largest and the impurity concentration measured by the SR method is the lowest. That is, the degree of the disorder 7 is the largest at the position that is closer to the first proton peak 6a than the intermediate position between the rear surface of the substrate and the first proton peak 6a. The reason is as follows. When the hydrogen ion (proton) implanted into the silicon substrate collides with a silicon atom, gives energy to the silicon atom, and is decelerated while forming distortion, that is, the disorder 7 in the silicon lattice, the position of the range Rp of the proton and the silicon lattice which is arranged in the vicinity of the position are a region which receives the largest amount of energy from the protons.

In particular, the region in which the silicon lattice receives the largest amount of energy from the protons radiated to the silicon substrate is disposed at the position where mobility is the lowest, that is, the position where carrier concentration is the lowest in the region in which the disorder 7 occurs. Therefore, the position where the second proton peak 6b is formed by the second proton irradiation may be the position where the degree of the disorder 7 is the largest by the first proton irradiation or in the vicinity of the position. Specifically, the position where the second proton peak 6b is formed by the second proton irradiation is closer to the position of the first proton peak 6a from the rear surface of the substrate than the intermediate position between the rear surface of the substrate and the position of the first proton peak 6a. The determination of the position of the second proton peak 6b enables the disorder 7 between the range Rp of the second proton irradiation and the range Rp of the first proton irradiation to supply defects required to generate donors when the hydrogen-related donor is formed in the vicinity of the range Rp of the second proton irradiation. As a result, the defects in the region of the disorder 7 compensate for the formation of donors to accelerate the formation of donors and the disorder 7 is removed.

Therefore, it is preferable that the difference between the range Rp of the first proton irradiation and the range Rp of the second proton irradiation be less than the range Rp of the second proton irradiation. It is more preferable that the difference between the range Rp of the first proton irradiation and the range Rp of the second proton irradiation be equal to or less than half of the range Rp of the second proton irradiation, in order to reliably remove the disorder 7. Alternatively, the distance b between the position of the first proton peak 6a (the peak position of carrier concentration measured by the SR method) and the position of the second proton peak 6b is preferably less than the distance a between the position of the second proton peak 6b and the rear surface of the substrate, and more preferably equal to or less than half of the distance a.

Alternatively, the difference between the distance from the position (the position where mobility is the lowest) where the carrier concentration measured by the SR method is the lowest in the disorder 7 generated by the formation of the first proton peak 6a to the rear surface of the substrate and the range Rp of the second proton irradiation is preferably less than the range Rp of the second proton irradiation and more preferably equal to or less than half of the range Rp of the second proton irradiation. In addition, the distance b between the position where the carrier concentration measured by the SR method is the lowest and the position of the second proton peak 6b is preferably less than the distance a between the position of the second proton peak 6b and the rear surface of the substrate, and more preferably equal to or less than half of the distance a.

It is preferable that the total number of proton peaks formed in the n-type FS layer 3 be equal to or more than 3. The reason is as follows. Among a plurality of proton peaks, a proton peak at the shallowest position (that is, the proton peak closest to the rear surface of the substrate) is formed at a depth less than 5 µm from the rear surface of the substrate such that the depletion layer reaches the p collector layer 4 (a desired field stop function is obtained). Therefore, when the total number of proton peaks formed in the n-type FS layer 3 is two, the second proton peak formed at the shallowest position is 5 µm away from the rear surface of the substrate in order to obtain the desired field stop function and the first proton peak formed at the deepest position is, for example, about 50 µm away from the rear surface of the substrate. In this case, since the distance between the first proton peak and the second proton peak is 45 µm, disorder is likely to occur. Therefore, it is preferable to form one proton peak between the proton peak which is formed at a shallow position from the rear surface of the substrate and the proton peak which is formed at a deep position from the rear surface of the substrate. In this way, as described above, it is possible to compensate for the hydrogen-related donor concentration of the n-type FS layer 3 and suppress a reduction in mobility. In addition, it is possible to remove disorder.

Figure 4:
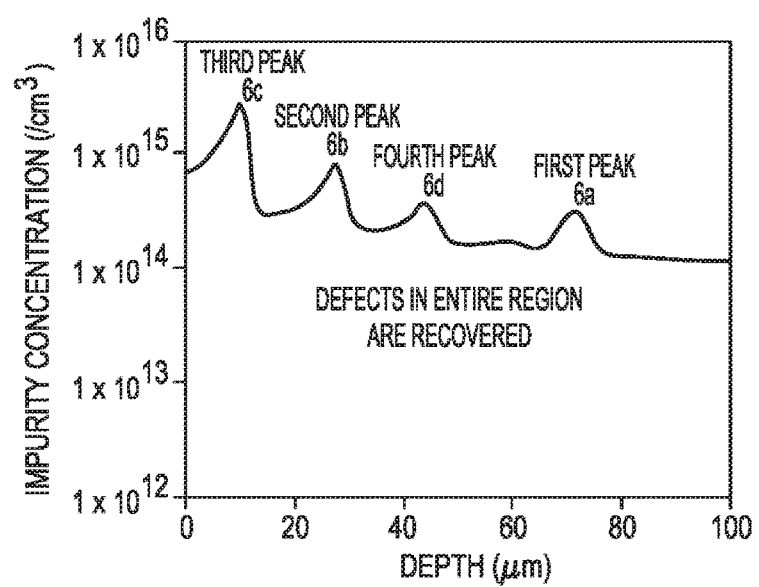
FIG. 4 is a characteristic diagram illustrating another example of the impurity concentration profile of the n-type FS layer in the semiconductor device according to Embodiment 1.

FIG. 4 is a characteristic diagram illustrating another example of the impurity concentration profile of the n-type FS layer in the semiconductor device according to Embodiment 1. As described above, the fourth proton irradiation may be performed for the disorder 7 which remains between the position of the first proton peak 6a and the position of the second proton peak 6b, without adjusting the second proton irradiation position. Specifically, as shown in FIGS. 1(a) and 1(b), the first to third proton peaks 6a to 6c are formed by the first to third proton irradiation operations. When the second proton irradiation position is not adjusted, the disorder 7 remains between the position of the first proton peak 6a and the position of the second proton peak 6b, as shown in FIG. 1(b).

The fourth proton irradiation is further performed for the disorder 7 which remains between the position of the first proton peak 6a and the position of the second proton peak 6b. In this way, as shown in FIG. 4, the fourth proton peak 6d is formed between the position of the first proton peak 6a and the position of the second proton peak 6b and it is possible to remove the entire disorder 7 in the n-type FS layer 3 or to reduce the degree of the disorder 7. An example of the detailed ion implantation conditions of the fourth proton irradiation for obtaining the impurity concentration profile of the n-type FS layer 3 without the disorder 7 will be described below. However, the ion implantation conditions are not particularly limited.

The acceleration energy and dose of the first proton irradiation are 1.5 MeV and $1 \times 10^{13}/cm^2$, respectively. The acceleration energy and dose of the second proton irradiation are 1.1 MeV and $1 \times 10^{13}/cm^2$, respectively. The acceleration energy and dose of the third proton irradiation are 0.8 MeV and $2 \times 10^{13}/cm^2$, respectively. The acceleration energy and dose of proton irradiation (that is, the fourth proton irradiation) for forming the fourth proton peak 6d are 0.4 MeV and $3 \times 10^{14}/cm^2$, respectively. The average range of the fourth proton irradiation is, for example, from about 6 µm to 15 µm from the rear surface of the substrate. It is preferable that, after the proton irradiation, an annealing process be performed, for example, at a temperature of about 380° C.

for 5 hours in a reduction atmosphere (for example, a hydrogen atmosphere in which hydrogen concentration is 3% or a nitrogen atmosphere including hydrogen).

As described above, according to Embodiment 1, the range of the proton irradiation is set to the above-mentioned conditions and the proton irradiation is performed a plurality of times, or the proton irradiation is performed a plurality of times such that the distance between the proton peaks formed by each proton irradiation operation satisfies the above-mentioned conditions. Therefore, it is possible to remove the disorder which is generated in the silicon substrate by the proton irradiation method according to the related art or to reduce the degree of disorder such that the disorder does not have an adverse effect on the element characteristics. As a result, it is possible to form an n-type FS layer in which no disorder occurs or the degree of disorder is reduced. Furthermore, it is possible to form an n-type FS layer with a desired field stop function in which impurity concentration (carrier concentration) is not greatly reduced or a reduction in impurity concentration is small. Therefore, it is possible to produce a semiconductor device with an FS structure capable of preventing deterioration of characteristics, such as a leakage current.

Embodiment 2

FIG. 5 is a characteristic diagram illustrating the impurity concentration profile of an n-type FS layer in a semiconductor device according to Embodiment 2. A semiconductor device production method according to Embodiment 2 differs from the semiconductor device production method according to Embodiment 1 in that a plurality of proton irradiation operations for removing disorder 17 or reducing the degree of the disorder 17 are sequentially performed from a deep position to a shallow position from the rear surface of a substrate in the region of the disorder 17.

The semiconductor device produced by the semiconductor device production method according to Embodiment 2 is, for example, an IGBT shown in FIG. 2(a), similarly to Embodiment 1. The semiconductor device production method according to Embodiment 2 is the same as the semiconductor device production method according to Embodiment 1 except for a proton irradiation method for forming an n-type FS layer 3. Therefore, only the proton irradiation method for forming the n-type FS layer 3 will be described (which holds for Embodiment 3).

Figure 5A:
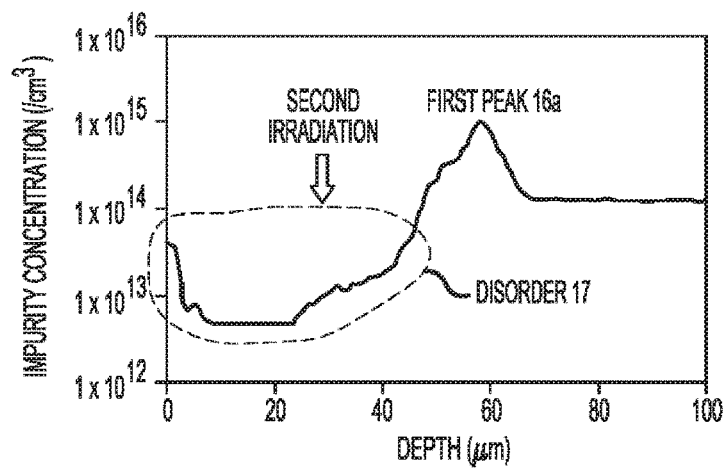
FIGS. 5(a) to 5(c) are characteristic diagrams illustrating the impurity concentration profile of an n-type FS layer in a semiconductor device according to Embodiment 2.
Figure 5B:
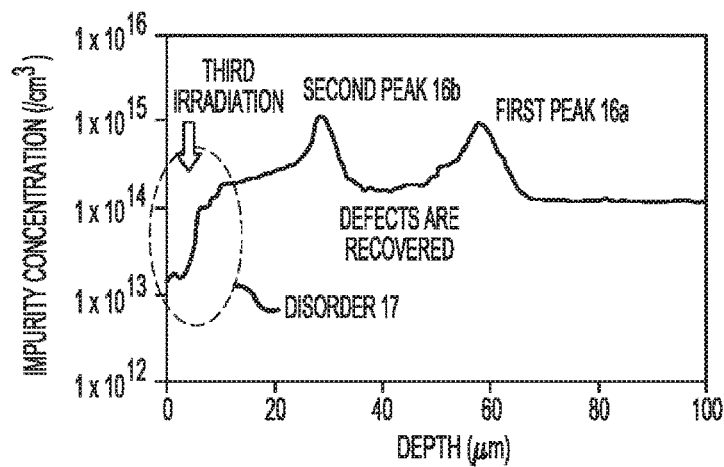
Figure 5C:
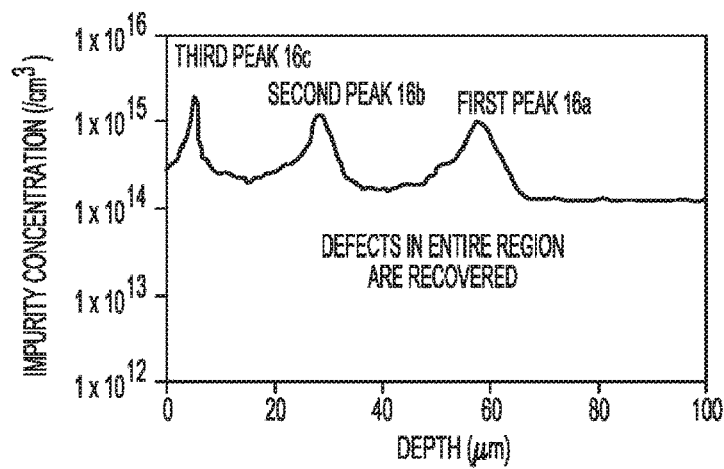

The proton irradiation method according to Embodiment 2 will be described in detail. FIGS. 5(a) to 5(c) show the impurity concentration profile of the n-type FS layer 3 after the first to third proton irradiation operations and annealing processes. As shown in FIG. 5(a), a first proton peak 16a is formed at a predetermined depth from the rear surface of the substrate by the first proton irradiation to form the region (a portion surrounded by a dotted line) of the disorder 17 between the rear surface of the substrate and the position of the first proton peak 16a, similarly to Embodiment 1.

Then, the distribution of the disorder 17 formed by the first proton irradiation is measured by the SR method. Then, the second proton irradiation is performed at a deep position (for example, a second irradiation position represented by an arrow in FIG. 5(a)) from the rear surface of the substrate in the region of the disorder 17 formed by the first proton irradiation. Then, as shown in FIG. 5(b), a second proton peak 16b is formed at a deep position from the rear surface of the substrate in the region of the disorder 17, which makes it possible to remove the disorder 17 at a deep position from the rear surface of the substrate or to reduce the degree of the disorder 17.

When the region of the disorder 17 remains between the rear surface of the substrate and the position of the second proton peak 16b, the third proton irradiation is performed for the region (for example, a third irradiation position represented by an arrow in FIG. 5(b)) of the disorder 17 which remains between the rear surface of the substrate and the position of the second proton peak 16b. Then, as shown in FIG. 5(c), a third proton peak 16c is formed at a shallow position from the rear surface of the substrate, which makes it possible to remove the entire disorder 17 of the n-type FS layer 3 or to reduce the degree of the disorder 17.

In the proton irradiation method according to Embodiment 2, the third proton irradiation is performed to remove the entire disorder 17 of the n-type FS layer 3 or to reduce the degree of the disorder 17. However, when the region of the disorder 17 remains between the rear surface of the substrate and the position of the third proton peak 16c, the fourth proton irradiation may be performed at a deep position in the region of the disorder 17 which remains between the rear surface of the substrate and the position of the third proton peak 16c.

As such, when the region of the disorder 17 remains between the rear surface of the substrate and the position of an m-th proton peak 16n, an (m+1)-th proton irradiation operation is performed at a deep position from the rear surface of the substrate in the remaining region of the disorder 17 and this process is repeated (m=1, 2, . . . , and n=a, b, . . . ). Then, the region of the disorder 17 which remains at a shallow position from the rear surface of the substrate is gradually reduced. An example of the detailed ion implantation conditions of three proton irradiation operations when the impurity concentration profile of the n-type FS layer 3 without the disorder 17 is obtained will be described below. However, the ion implantation conditions are not particularly limited.

The acceleration energy and dose of the first proton irradiation are 2.0 MeV (average range: 47.7 µm) and $3 \times 10^{13}/cm^2$, respectively. The acceleration energy and dose of the second proton irradiation is 1.5 MeV (average range: 30.3 µm) and $3 \times 10^{13}/cm^2$, respectively. The acceleration energy and dose of the third proton irradiation are 0.5 MeV (average range: 6.0 µm) and $2 \times 10^{14}/cm^2$, respectively. It is preferable that, after the proton irradiation, an annealing process be performed, for example, at a temperature of about 380° C. for 5 hours in a reduction atmosphere (for example, a hydrogen atmosphere in which hydrogen concentration is 3% or a nitrogen atmosphere including hydrogen). The annealing process after the proton irradiation may be performed under the conditions of a temperature of about 300° C. to 450° C. and a processing time of about 1 to 10 hours according to the required specifications of the n-type FS layer 3.

As described above, according to Embodiment 2, it is possible to obtain the same effect as that in Embodiment 1.

Embodiment 3

FIG. 6 is a characteristic diagram illustrating the impurity concentration profile of an n-type FS layer in a semiconductor device according to Embodiment 3. A semiconductor device production method according to Embodiment 3 differs from the semiconductor device production method according to Embodiment 1 in that a plurality of proton irradiation operations for removing disorder 27 or reducing the degree of the disorder 27 are sequentially performed from a shallow position to a deep position from the rear surface of a substrate in the region of the disorder 27.

Figure 6A:
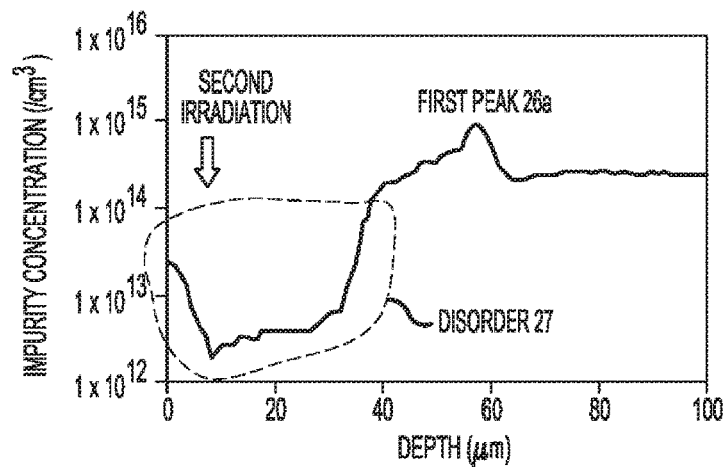
FIGS. 6(a) to 6(c) are characteristic diagrams illustrating the impurity concentration profile of an n-type FS layer in a semiconductor device according to Embodiment 3.
Figure 6B:
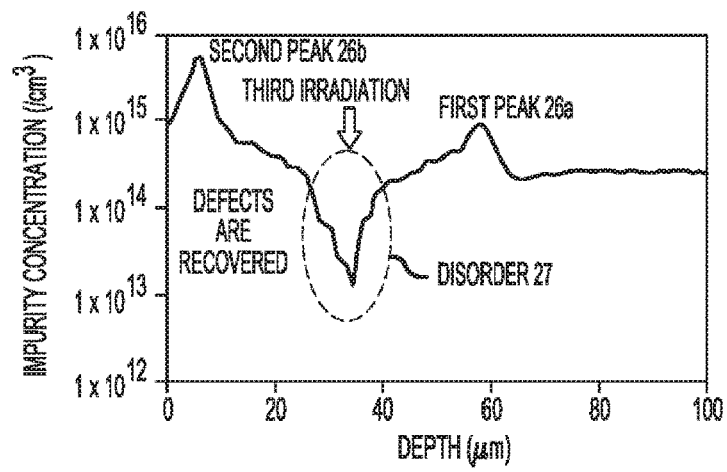
Figure 6C:
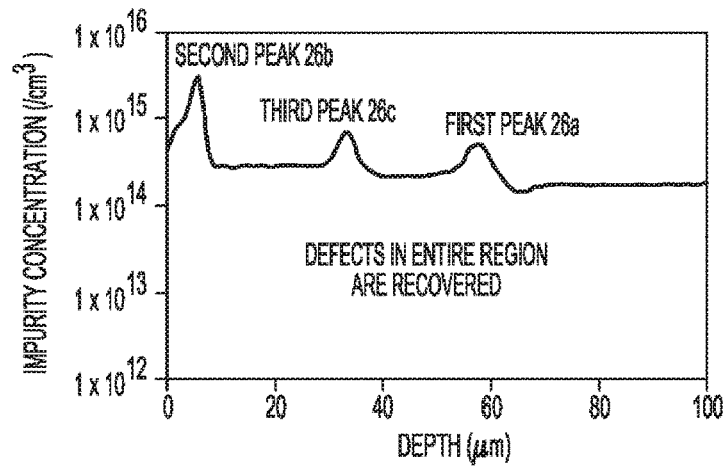

A proton irradiation method according to Embodiment 3 will be described. FIGS. 6(a) to 6(c) show the impurity concentration profile of an n-type FS layer 3 after the first to third proton irradiation operations and annealing processes. As shown in FIG. 6(a), a first proton peak 26a is formed at a predetermined depth from the rear surface of the substrate by the first proton irradiation to form the region (a portion surrounded by a dotted line) of the disorder 27 between the rear surface of the substrate and the position of the first proton peak 26a, similarly to Embodiment 1.

Then, the second proton irradiation is performed at a shallow position (for example, a second irradiation position represented by an arrow in FIG. 6(a)) from the rear surface of the substrate in the region of the disorder 27 formed by the first proton irradiation. Then, as shown in FIG. 6(b), a second proton peak 26b is formed at a shallow position from the rear surface of the substrate in the region of the disorder 27. Therefore, it is possible to remove the disorder 27 at this position or to reduce the degree of the disorder 27.

When the region of the disorder 27 remains between the position of the first proton peak 26a and the position of the second proton peak 26b, the third proton irradiation is performed for the region (for example, a third irradiation position represented by an arrow in FIG. 6(b)) of the disorder 27 which remains between the position of the first proton peak 26a and the position of the second proton peak 26b. Then, as shown in FIG. 6(c), a third proton peak 26c is formed between the position of the first proton peak 26a and the position of the second proton peak 26b. Therefore, it is possible to remove the entire disorder 27 of the n-type FS layer 3 or to reduce the degree of the disorder 27.

Figure 7A:
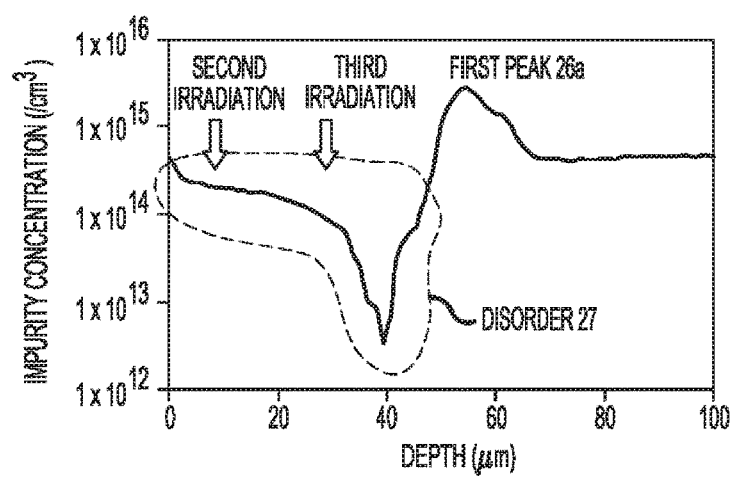
FIGS. 7(a) to 7(c) are characteristic diagrams illustrating another example of the impurity concentration profile of the n-type FS layer in the semiconductor device according to Embodiment 3.
Figure 7B:
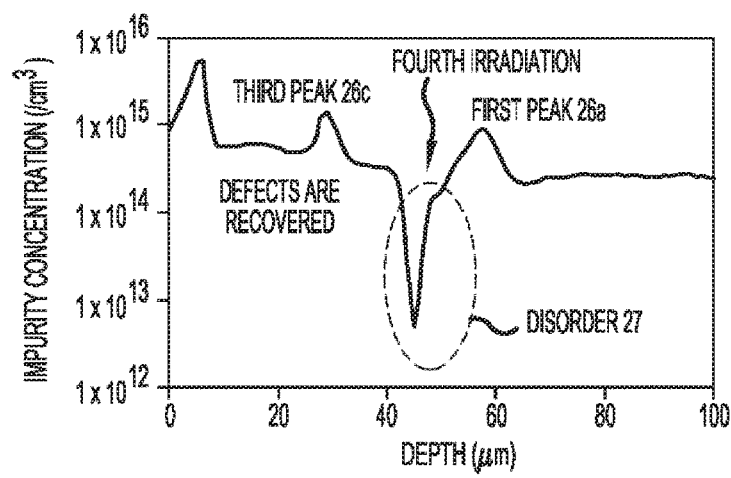

FIG. 7 is a characteristic diagram illustrating another example of the impurity concentration profile of the n-type FS layer in the semiconductor device according to Embodiment 3. As shown in FIGS. 7(a) and 7(b), when the region of the disorder 27 remains between the position of the first proton peak 26a and the position of the third proton peak 26c after the second and third proton peaks 26b and 26c are formed by the second and third proton irradiation operations, the fourth proton irradiation may be performed for the region of the remaining disorder 27 (for example, a fourth irradiation position represented by an arrow in FIG. 7(b)).

Figure 7C:
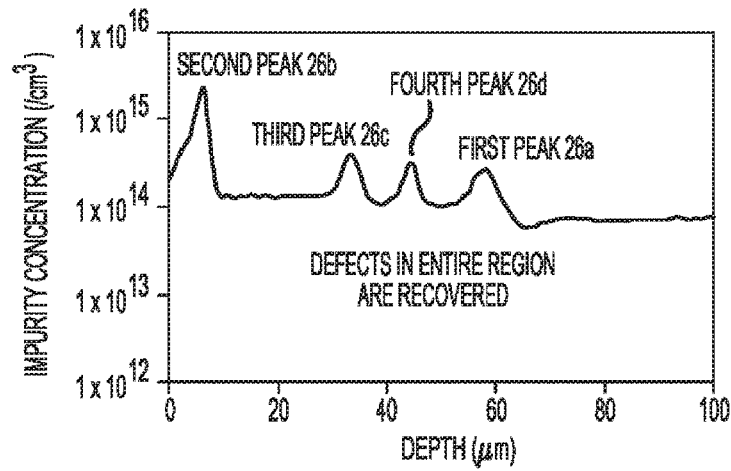
Figure 8A:
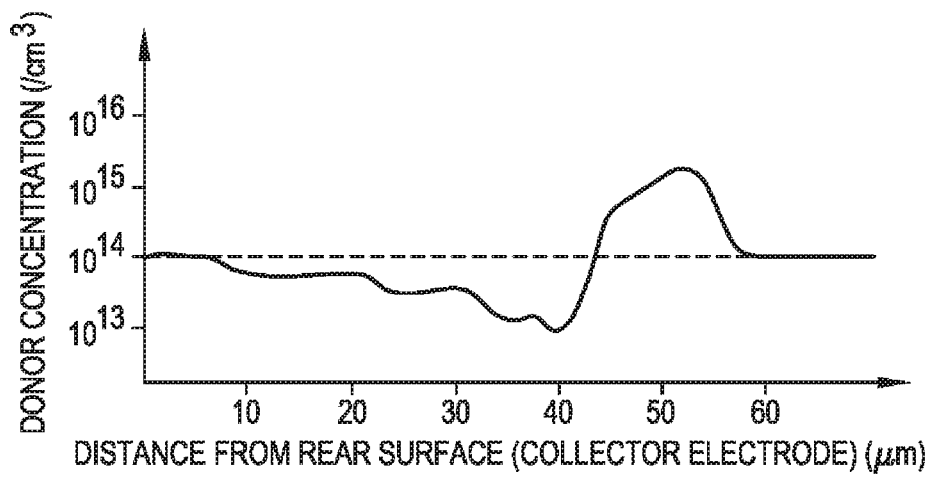
FIGS. 8(a) to 8(c) are characteristic diagrams illustrating the relation between carrier concentration and the average range of proton irradiation in the related art.
Figure 8B:
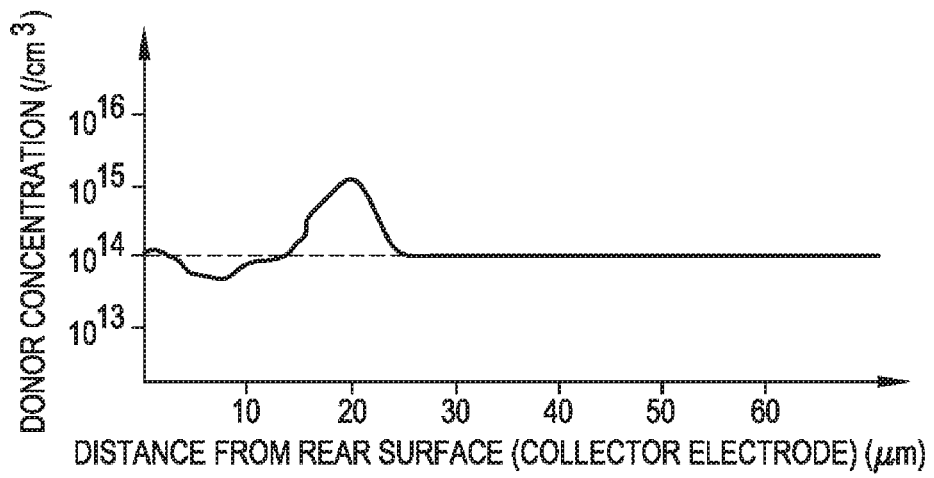
Figure 8C:
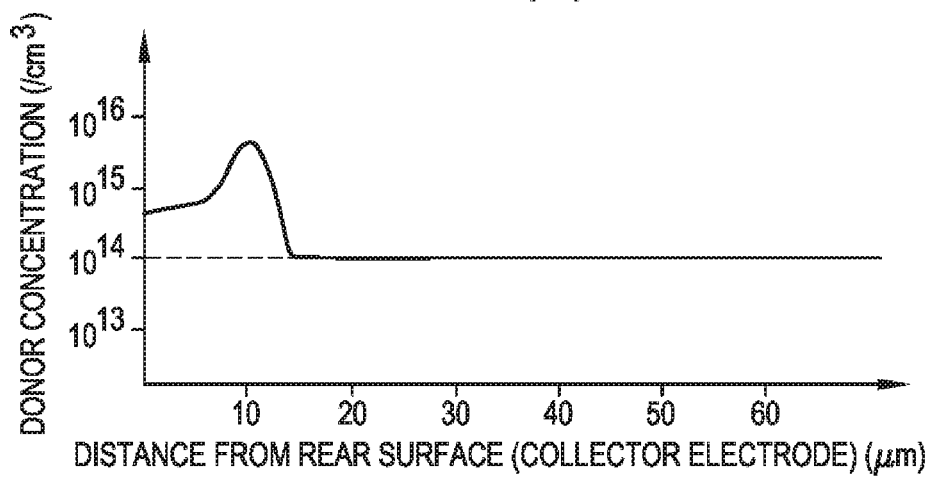

As shown in FIG. 7(c), a fourth proton peak 26d is formed between the position of the first proton peak 26a and the position of the third proton peak 26c by the fourth proton irradiation. Therefore, it is possible to remove the entire disorder 27 of the n-type FS layer 3 or to reduce the degree of the disorder 27.

As such, when the region of the disorder 27 remains between the position of the first proton peak 26a and the position of an (m+1)-th proton peak 26n after an (m+1)-th proton irradiation operation, an (m+2)-th proton irradiation operation is performed for the region of the disorder 27 between the position of the first proton peak 26a and the position of the (m+1)-th proton peak 26n (m=2, 3, . . . , and n=b, c, . . . ). Then, the region of the disorder 27 which remains between the positions of the proton peaks is gradually reduced.

As described above, according to Embodiment 3, it is possible to obtain the same effect as that in Embodiment 1.

Embodiment 4

Figure 11:
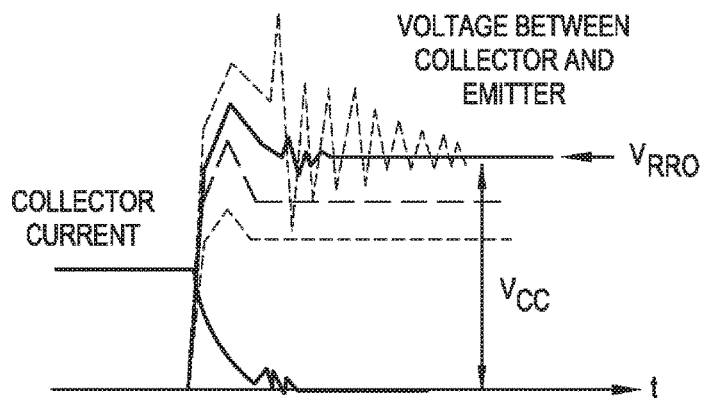
FIG. 11 is a diagram illustrating an oscillation waveform when the IGBT is turned off.

The preferred position of a first proton peak will be described below. FIG. 11 shows an oscillation waveform when an IGBT is turned off. When a collector current is equal to or less than one-tenth of the rated current, in some cases, the number of carriers accumulated is small and oscillation occurs before the IGBT is turned off. The collector current is fixed to a certain value and the IGBT is turned off by a different power supply voltage VCC. In this case, when the power supply voltage VCC is greater than a predetermined value, it is greater than the peak value of a general overshoot voltage in the voltage waveform between the collector and the emitter and an additional overshoot occurs. The additional overshoot (voltage) serves as a trigger and the subsequent waveform oscillates. When the power supply voltage VCC is greater than the predetermined value, the additional overshoot voltage further increases and the subsequent oscillation amplitude also increases. As such, a threshold voltage at which the voltage waveform starts to oscillate is referred to as an oscillation start threshold value VRRO. When the oscillation start threshold value VRRO increases, the IGBT does not oscillate when it is turned off, which is preferable.

The oscillation start threshold value VRRO depends on the position of the first proton peak that a depletion layer (strictly, a space charge region since there is a hole) which is spread from the pn junction between a p-type base layer and an n⁻ drift layer of the IGBT to the n⁻ drift layer reaches first, among a plurality of proton peaks. The reason is as follows. When the depletion layer is spread from the p-type base layer in the front surface to the n⁻ drift layer at the time the IGBT is turned off, the end of the depletion layer reaches the first n-type FS layer and the spreading of the depletion layer is suppressed. The sweep of the accumulated carriers is weakened. As a result, the depletion of the carriers is suppressed and oscillation is suppressed.

When the IGBT is turned off, the depletion layer is spread from the pn junction between the p base layer and the n⁻ drift layer toward the collector electrode in the depth direction. Therefore, the peak position of the n-type FS layer which the end of the depletion layer reaches first is the n-type FS layer which is closest to the pn junction. Here, the thickness of the n⁻ semiconductor substrate (the thickness of a portion interposed between the emitter electrode and the collector electrode) is W0 and the depth of the peak position of the n-type FS layer which the end of the depletion layer reaches first from the interface between the collector electrode and the rear surface of the n⁻ semiconductor substrate (hereinafter, referred to as a distance from the rear surface) is X. A distance index L is introduced. The distance index L is represented by the following Expression (1).

$$L = \sqrt{\frac{\varepsilon_S V_{rate}}{q\left(\frac{J_F}{qv_{sat}} + N_d\right)}} \qquad \text{Expression (1)}$$

The distance index L represented by the above-mentioned Expression (1) is an index indicating the distance of the end (depletion layer end) of the depletion layer (space charge region), which is spread from the pn junction to n⁻ drift layer 21, from the pn junction when a voltage VCE between the collector and the emitter is a power supply voltage VCC, at the time the IGBT is turned off. In a fraction in the square root, a denominator indicates the space charge density of the space charge region (simply, the depletion layer) when the IGBT is turned off. The known Poisson equation is represented by divE=ρ/ε, in which E is electric field intensity, ρ is space charge density, and ρ=q(p−n+Nd−Na) is established. Here, q is an elementary charge, p is hole concentration, n is electron concentration, Nd is donor concentration, Na is acceptor concentration, and $\varepsilon_s$ is the permittivity of a semiconductor.

The space charge density ρ is described by the hole concentration p passing through the space charge region (depletion layer) when the IGBT is turned off and the average donor concentration Ndm of the n⁻ drift layer. The electron concentration is lower than these concentrations so as to be negligible and there is no acceptor. Therefore, ρ≈q(p+Ndm) is established. In this case, the hole concentration p is determined by a breaking current of the IGBT. In particular, since it is assumed that the element is being energized, the rated current density is expressed by $p=J_F/(qv_{sat})$. $J_F$ is the rated current density of the element and $v_{sat}$ is a saturated velocity in which the speed of the carrier is saturated with predetermined electric field intensity.

The Poisson equation is integrated with respect to the distance x two times and the voltage V satisfies E=-gradV (the relationship between the known electric field E and the voltage V). Therefore, under appropriate boundary conditions, $V=(1/2)(\rho/\varepsilon)x^2$ is established. The length x of the space charge region obtained when the voltage V is half of the rated voltage BV is the distance index L. This is because an operation voltage (power supply voltage), which is the voltage V, is about half of the rated voltage in the actual device such as an inverter. When the doping concentration of the FS layer is higher than that of the n⁻ drift layer, the n-type FS layer prevents the expansion of the space charge region which is spread at the time the IBGT is turned off. In a case in which the collector current of the IGBT starts to be reduced from the breaking current due to the turn-off of a MOS gate, when the peak position of the FS layer which the depletion layer reaches first is in the space charge region, it is possible to suppress the expansion of the space charge region, with the accumulated carriers remaining in the n⁻ drift layer. Therefore, the sweep of the remaining carriers is suppressed.

In the actual turning-off operation, for example, when a motor is driven by a known PWM inverter with an IGBT module, the power supply voltage or the breaking current is not fixed, but is variable. Therefore, in this case, the preferred peak position of the n-type FS layer which the depletion layer reaches first needs to have a given width. According to the results of the inventors' research, the distance X of the peak position of the n-type FS layer which the depletion layer reaches first from the rear surface is as shown in FIG. 13. FIG. 13 is a table illustrating the position conditions of the FS layer which the depletion layer reaches first in the semiconductor device according to the invention. FIG. 13 shows the distance X of the peak position of the FS layer which the end of the depletion layer reaches first from the rear surface at a rated voltage of 600 V to 6500 V. Here, X=W0-γL is established and γ is a coefficient. FIG. 19 shows the distance X when γ is changed from 0.7 to 1.6.

As shown in FIG. 13, at each rated voltage, the element (IGBT) is safely designed so as to have a breakdown voltage which is about 10% higher than the rated voltage. As shown in FIG. 13, the total thickness of the n⁻ semiconductor substrate (the thickness during a finishing process after the n⁻ semiconductor substrate is thinned by, for example, grinding) and the average resistivity of the n⁻ drift layer are set such that an on-voltage or turn-off loss is sufficiently reduced. The term 'average' means the average concentration and resistivity of the entire n⁻ drift layer including the FS layer. The rated current density has the typical value shown in FIG. 13 due to the rated voltage. The rated current density is set such that energy density which is determined by the product of the rated voltage and the rated current density has a substantially constant value and has nearly the value shown in FIG. 13. When the distance index L is calculated using these values according the above-mentioned Expression (1), the value shown in FIG. 13 is obtained. The distance X of the peak position of the n-type FS layer which the end of the depletion layer reaches first from the rear surface is obtained by subtracting the product of the distance index L and γ, which is in the range of 0.7 to 1.6, from the thickness W0 of the n⁻ semiconductor substrate.

Figure 9:
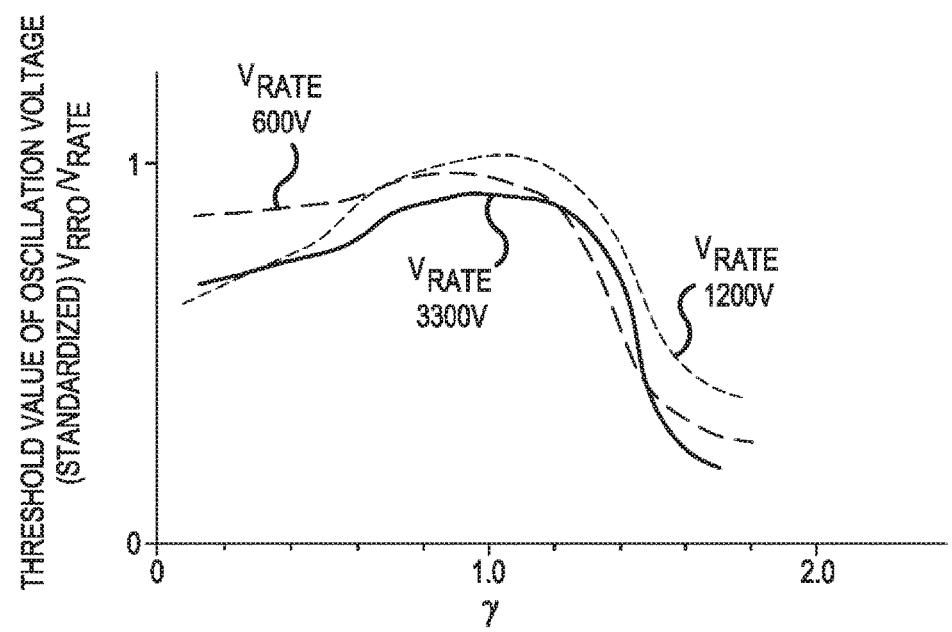
FIG. 9 is a characteristic diagram illustrating a threshold voltage at which a voltage waveform starts to oscillate.

The distance X of the peak position of the FS layer which the end of the depletion layer reaches first from the rear surface, at which turn-off oscillation is sufficiently suppressed, is as follows with respect to the distance index L and the thickness W0 of the n⁻ semiconductor substrate. FIG. 9 is a characteristic diagram illustrating a threshold voltage at which the voltage waveform starts to oscillate. FIG. 9 shows the dependence of $V_{RRO}$ on γ at some typical rated voltages $V_{rate}$ (600 V, 1200 V, and 3300 V). In FIG. 9, the vertical axis indicates a value obtained by standardizing VRRO with the rated voltage $V_{rate}$. As can be seen from FIG. 9, $V_{RRO}$ can be rapidly increased at three rated voltages when γ is equal to or less than 1.4. When γ is in the range of 0.8 to 1.3, it is possible to sufficiently increase VRRO at any rated voltage. More preferably, when γ is in the range of 0.9 to 1.2, it is possible to maximize $V_{RRO}$.

The important point in FIG. 9 is that the range of γ capable of sufficiently increasing $V_{RRO}$ is substantially the same (0.8 to 1.3) at all rated voltages. The reason is that it is most effective to set the range of the distance X of the peak position of the n-type FS layer which the depletion layer reaches first from the rear surface to be centered on W0-L (that is, γ=1). That is, this characteristic is caused by the nearly constant value of the product of the rated voltage and the rated current density. Therefore, when the distance X of the peak position of the n-type FS layer which the end of the depletion layer reaches first from the rear surface is set in the above-mentioned range, the accumulated carriers can sufficiently remain in the IGBT at the time the IGBT is turned off and it is possible to suppress the oscillation phenomenon at the time the IGBT is turned off. Therefore, for the distance X of the peak position of the n-type FS layer which the end of the depletion layer reaches first from the rear surface, it is preferable that the coefficient γ of the distance index L be in the above-mentioned range at any rated voltage. In this way, it is possible to effectively suppress the oscillation phenomenon at the time the IGBT is turned off.

Figure 12:
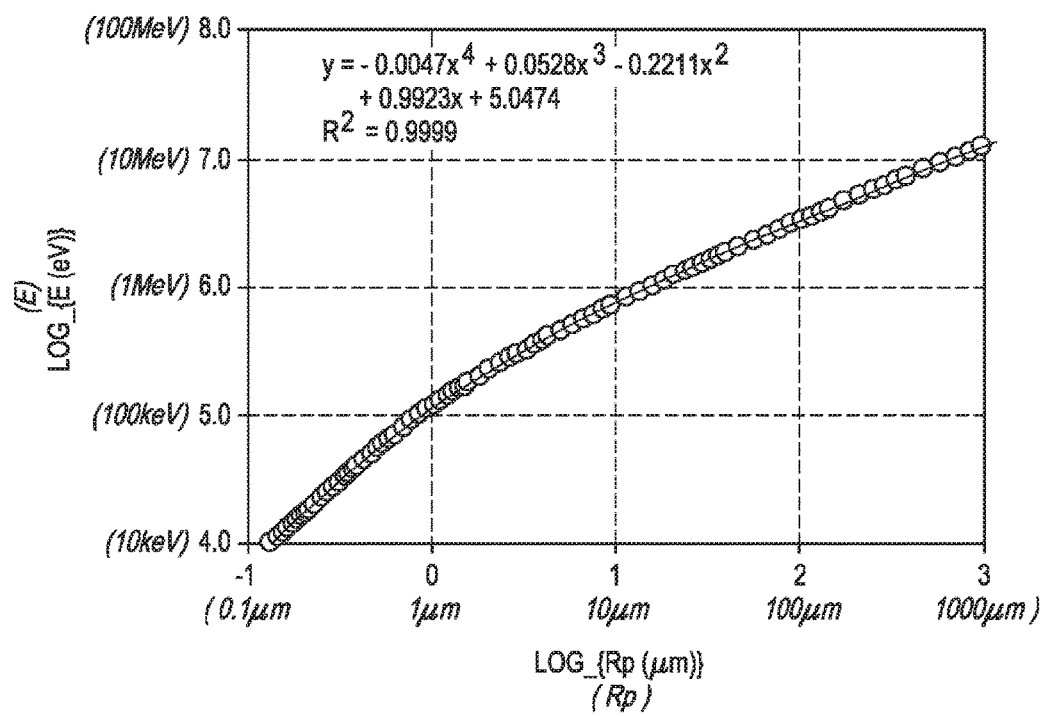
FIG. 12 is a characteristic diagram illustrating the relation between the range of protons and the acceleration energy of the protons in the semiconductor device according to the invention.

The acceleration energy of protons may be determined from the following characteristic graph shown in FIG. 12 in order to form the n-type FS layer with the peak position which the depletion layer first reaches and which is at the distance X from the rear surface, using proton irradiation, such that the above-mentioned range of γ is satisfied in practice.

The results of the inventors' research proved that, for the range Rp (the peak position of the n-type FS layer) of protons and the acceleration energy E of protons, when the logarithm log(Rp) of the range Rp of the protons was x and the logarithm log(E) of the acceleration energy E of the protons was y, x and y satisfied the following relationship represented by Expression (2).

$$y=-0.0047x^4+0.0528x^3-0.2211x^2+0.9923x+5.0474 \quad \text{Expression (2)}$$

FIG. 12 is a characteristic graph indicating the above-mentioned Expression (2). FIG. 12 is a characteristic diagram illustrating the relationship between the range of the protons and the acceleration energy of the protons in the semiconductor device according to the invention. FIG. 12 shows the acceleration energy of the protons for obtaining the desired range of the protons. In FIG. 12, the horizontal axis is the logarithm log(Rp) of the range Rp of the protons and indicates the range Rp (µm) corresponding to the parentheses below the axis value of log(Rp). In addition, the vertical axis is the logarithm log(E) of the acceleration energy E of the protons and indicates the acceleration energy E of the protons corresponding to the parentheses on the left side of the axis value of log(E). The above-mentioned Expression (2) is obtained by fitting the value of the logarithm log(Rp) of the range Rp of the protons and the value of the logarithm log(E) of the acceleration energy with a four-order polynomial of x (=log(Rp)).

The following relationship may be considered between the actual acceleration energy E' and an average range Rp' (proton peak position) which is actually obtained by the spreading resistance (SR) method when the above-mentioned fitting equation is used to calculate the acceleration energy E of proton irradiation from the desired average range Rp of protons and to set the acceleration energy E and protons are implanted into silicon. When the actual acceleration energy E' is in the range of about □5% of the calculated value E of the acceleration energy, the actual average range Rp' is within the range of about +/−5% of the desired average range Rp and is in a measurement error range. Therefore, the influence of a variation in the actual average range Rp' from the desired average range Rp on the electrical characteristics of the IGBT is so small to be negligible. When the actual acceleration energy E' is in the range of +/−5% of the calculated value E, it is possible to determine that the actual average range Rp' is substantially equal to the set average range Rp. In the actual accelerator, since the acceleration energy E and the average range Rp are both in the above-mentioned ranges (+/−5%), it is considered that the actual acceleration energy E' and the actual average range Rp' follow the above-mentioned fitting equation represented by the desired average range Rp and the calculated value E and no problem occurs.

The above-mentioned Expression (2) is used to calculate the acceleration energy E of the protons required to obtain the desired range Rp of the protons. The acceleration energy E of each proton for forming the FS layer is also calculated by the above-mentioned Expression (2) and is well matched with the value which is measured from a sample by the known spreading resistance measurement method (SR method) after proton irradiation is performed with the above-mentioned acceleration energy. Therefore, when the above-mentioned Expression (2) is used, it is possible to predict the required acceleration energy E of protons with high accuracy, on the basis of the range Rp of the protons.

As described above, according to Embodiment 4, it is possible to obtain the same effect as that in Embodiment 1.

In the above-mentioned embodiment, the IGBT is given as an example, but the invention is not limited thereto. For example, the invention can be applied to a diode. In addition, the invention can be applied to semiconductor devices with a breakdown voltage of, for example, 600 V, 1200 V, 1700 V, 3300 V, 4500 V, and 6000 V.

As described above, the semiconductor device and the method for producing the semiconductor device according to the invention are useful as power semiconductor devices used for power conversion apparatuses such as converters or inverters.

Thus, a semiconductor device has been described according to the present invention. Many modifications and variations may be made to the techniques and structures described and illustrated herein without departing from the spirit and scope of the invention. Accordingly, it should be understood that the methods and devices described herein are illustrative only and are not limiting upon the scope of the invention.

REFERENCE SIGNS LIST 1 n⁻ drift layer (high-resistance semiconductor layer)
2 n+ emitter layer
3 n-type fs layer
4 p collector layer
6a, 16a, 26a first proton peak
6b, 16b, 26b second proton peak
6c, 16c, 26c third proton peak
6d, 26d fourth proton peak
7 disorder
10 IGBT

What is claimed is:
1. A semiconductor device, comprising:
an n-type semiconductor substrate having a front main surface and a rear main surface, the front main surface and the rear main surface being opposite surfaces of the n-type semiconductor substrate in a depth direction of the n-type semiconductor substrate;
a p-type base layer disposed in the front main surface of the n-type semiconductor substrate;
a MOS gate structure disposed in the front main surface of the n-type semiconductor substrate and including the p-type base layer, an n-type emitter layer, an interlayer dielectric, a gate insulating film, and a gate electrode;
an n-type field stop layer provided in the n-type semiconductor substrate and having an impurity concentration that is greater than an impurity concentration of the n-type semiconductor substrate, wherein:
the n-type field stop layer includes hydrogen-related donors,
the n-type field stop layer has an impurity concentration distribution including a plurality of impurity concentration peaks at different positions in the depth direction of the n-type semiconductor substrate,
the plurality of impurity concentration peaks include a first impurity concentration peak disposed at a first position having a first depth from the rear main surface, a second impurity concentration peak disposed at a second position having a second depth from the rear main surface that is less than the first depth, and a third impurity concentration peak disposed at a third position having a third depth from the rear main surface, the third depth being less than the first depth and greater than the second depth,
the first depth is 15 µm or more, and
a first distance between the first position of the first impurity concentration peak and the second position of the second impurity concentration peak is equal to or more than a second distance between the second position of the second impurity concentration peak and the rear main surface of the n-type semiconductor substrate.
2. The semiconductor device of claim 1, wherein the impurity concentration distribution of the field stop layer further includes a first sloped region extending from the first impurity concentration peak, a second sloped region extending from the third impurity concentration peak, and a third region connecting the first sloped region to the second sloped region such that the first impurity concentration peak is connected to the third impurity concentration peak via the first sloped region, the third region, and the second sloped region, and
an impurity concentration in the third region connecting the first sloped region to the second sloped region is substantially uniform.

3. The semiconductor device of claim 1, wherein a third distance between the first position of the first impurity concentration peak and the third position of the third impurity concentration peak is equal to or less than a fourth distance between the third position of the third impurity concentration peak and the rear main surface of the n-type semiconductor substrate.

4. The semiconductor device of claim 1, wherein the plurality of impurity concentration peaks further include a fourth impurity concentration peak disposed at a fourth position having a fourth depth from the rear main surface, the fourth depth being less than the second depth.

5. A semiconductor device, comprising:
an n-type semiconductor substrate having a front main surface and a rear main surface, the front main surface and the rear main surface being opposite surfaces of the n-type semiconductor substrate in a depth direction of the n-type semiconductor substrate;
a p-type base layer disposed in the front main surface of the n-type semiconductor substrate;
a MOS gate structure disposed in the front main surface of the n-type semiconductor substrate and including the p-type base layer, an n-type emitter layer, an interlayer dielectric, a gate insulating film, and a gate electrode;
an n-type field stop layer provided in the n-type semiconductor substrate and having an impurity concentration that is greater than an impurity concentration of the n-type semiconductor substrate, wherein:
the n-type field stop layer includes hydrogen-related donors,
the n-type field stop layer has an impurity concentration distribution including a plurality of impurity concentration peaks at different positions in the depth direction of the n-type semiconductor substrate,
the plurality of impurity concentration peaks include a first impurity concentration peak disposed at a first position having a first depth from the rear main surface and a second impurity concentration peak disposed at a second position having a second depth from the rear main surface that is greater than the first depth,
a first distance between the first position of the first impurity concentration peak and the rear main surface of the n-type semiconductor substrate is equal to or more than a second distance between the second position of the second impurity concentration peak and the first position of the first impurity concentration peak,
the second depth is 15 μm or more,
a distance index L indicating a distance from an end of a depletion layer, which is spread from an end of the base layer along a direction from the front main surface to the rear main surface at the time the semiconductor device is turned off, to the end of the base layer is represented by the following Expression (1) and
a thickness of the n-type semiconductor substrate is W0, a distance X from a position of an impurity concentration peak which the depletion layer reaches first in the n-type field stop layer to the rear main surface of the n-type semiconductor substrate satisfies W0−1.4 L≤X≤W0−0.8 L $$L = \sqrt{\frac{\varepsilon_S V_{rate}}{q\left(\frac{J_F}{qv_{sat}} + N_d\right)}} \quad (1)$$

(where $V_{rate}$ is a rated voltage, εs is the permittivity of the n-type semiconductor substrate, q is an elementary charge, $J_F$ is rated current density, $v_{sat}$ is a saturated velocity of carriers, and $N_d$ is the average donor concentration of the n-type semiconductor substrate).

6. The semiconductor device of claim 5, wherein the distance X is from the second impurity concentration peak to the rear main surface of the n-type semiconductor substrate.

7. The semiconductor device of claim 5, wherein the plurality of impurity concentration peaks further include a third impurity concentration peak disposed at a third position having a third depth from the rear main surface, the third depth being less than the first depth.

8. A semiconductor device, comprising:
an n-type semiconductor substrate having a front main surface and a rear main surface, the front main surface and the rear main surface being opposite surfaces of the n-type semiconductor substrate in a depth direction of the n-type semiconductor substrate;
a p-type base layer disposed in the front main surface of the n-type semiconductor substrate;
a MOS gate structure disposed in the front main surface of the n-type semiconductor substrate and including the p-type base layer, an n-type emitter layer, an interlayer dielectric, a gate insulating film, and a gate electrode;
an n-type field stop layer provided in the n-type semiconductor substrate and having an impurity concentration that is greater than an impurity concentration of the n-type semiconductor substrate, wherein:
the n-type field stop layer includes hydrogen-related donors,
the n-type field stop layer has an impurity concentration distribution including a plurality of impurity concentration peaks at different positions in the depth direction of the n-type semiconductor substrate,
the plurality of impurity concentration peaks include a first impurity concentration peak disposed at a first position having a first depth from the rear main surface and a second impurity concentration peak disposed at a second position having a second depth from the rear main surface that is greater than the first depth,
the impurity concentration distribution of the field stop layer further includes a first sloped region extending from the first impurity concentration peak, a second sloped region extending from the second impurity concentration peak, and a third region connecting the first sloped region to the second sloped region such that the first impurity concentration peak is connected to the second impurity concentration peak via the first sloped region, the third region, and the second sloped region,
a first distance between the first position of the first impurity concentration peak and the rear main surface of the n-type semiconductor substrate is equal to or more than a second distance between the second position of the second impurity concentration peak and the first position of the first impurity concentration peak,
the second depth is 15 μm or more, and
an impurity concentration in the third region connecting the first sloped region to the second sloped region is substantially uniform.

9. The semiconductor device of claim 8, wherein the plurality of impurity concentration peaks further include a third impurity concentration peak disposed at a third position having a third depth from the rear main surface, the third depth being less than the second depth.

* * * * *